US012622277B2

(12) United States Patent
Shin et al.

(10) Patent No.: US 12,622,277 B2
(45) Date of Patent: May 5, 2026

(54) SEMICONDUCTOR DEVICE AND METHOD OF PARTIAL SHIELDING WITH EMBEDDED GRAPHENE CORE SHELLS

(71) Applicant: STATS ChipPAC Pte. Ltd., Singapore (SG)

(72) Inventors: YongMoo Shin, Incheon (KR); HeeSoo Lee, Incheon (KR); HeeYoun Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 431 days.

(21) Appl. No.: 18/188,720

(22) Filed: Mar. 23, 2023

(65) Prior Publication Data

US 2024/0321768 A1 Sep. 26, 2024

(51) Int. Cl.
 *H01L 23/498* (2006.01)
 *H01L 21/56* (2006.01)
 (Continued)

(52) U.S. Cl.
 CPC .......... *H01L 23/552* (2013.01); *H01L 21/565* (2013.01); *H01L 23/29* (2013.01); (Continued)

(58) Field of Classification Search
 None
 See application file for complete search history.

(56) References Cited

U.S. PATENT DOCUMENTS

| | | |
|---|---|---|
| 6,114,413 A | 9/2000 | Kang et al. |
| 7,659,145 B2 | 2/2010 | Do et al. |

(Continued)

FOREIGN PATENT DOCUMENTS

| | | |
|---|---|---|
| CN | 102867793 A | 1/2013 |
| CN | 110071074 A | 7/2019 |
| KR | 10-1465616 | 11/2014 |
| KR | 20150142090 A | 12/2015 |
| KR | 10-1895114 | 9/2018 |

(Continued)

OTHER PUBLICATIONS

Graphmatech, "Graphmatech's Graphene Technology Unlocks the Potential of Copper Additive Manufacturing" Website: https://graphmatech.com/graphmatechs-graphene-technology-unlocks-the-potential-of-copper-additive-manufacturing/, Feb. 9, 2021, Uppsala, Sweden.

(Continued)

*Primary Examiner* — Long Pham
(74) *Attorney, Agent, or Firm* — Robert D. Atkins; PATENT LAW GROUP: Atkins and Associates, P.C.

(57) ABSTRACT

A semiconductor device has a substrate and an electrical component disposed over the substrate. A first encapsulant is deposited over the electrical component and substrate. A first shielding layer with a graphene core shell is formed on a surface of the first encapsulant. A second encapsulant is deposited over the first encapsulant and first shielding layer. A second shielding layer is formed over the second encapsulant. The first shielding layer is formed at least partially in an opening of the first encapsulant. The graphene core shell has a copper core. The first shielding layer has a plurality of cores covered by graphene and the graphene is interconnected within the first shielding layer to form an electrical path. The electrical path dissipates any charge incident on shielding layer, such as an ESD event, to reduce or inhibit the effects of EMI, RFI, and other inter-device interference.

19 Claims, 23 Drawing Sheets

(51) Int. Cl.

| | |
|---|---|
| *H01L 23/00* | (2006.01) |
| *H01L 23/29* | (2006.01) |
| *H01L 23/552* | (2006.01) |
| *H01L 23/66* | (2006.01) |

(52) U.S. Cl.

CPC ............. *H01L 23/66* (2013.01); *H01L 24/16* (2013.01); *H01L 2223/6661* (2013.01); *H01L 2224/16227* (2013.01); *H01L 2924/186* (2013.01); *H01L 2924/3025* (2013.01)

(56) References Cited

U.S. PATENT DOCUMENTS

| | | | |
|---|---|---|---|
| 7,700,943 B2 | 4/2010 | Raravikar et al. | |
| 7,886,813 B2 | 2/2011 | Hua et al. | |
| 7,989,707 B2 | 8/2011 | Yamano et al. | |
| 8,106,495 B2 | 1/2012 | Kajiki | |
| 8,107,242 B2 | 1/2012 | Yoshimoto et al. | |
| 8,263,439 B2 | 9/2012 | Marimuthu et al. | |
| 8,421,232 B2 | 4/2013 | Ikeda et al. | |
| 8,535,553 B2 * | 9/2013 | Kong ..................... | B82Y 40/00 |
| | | | 216/83 |
| 8,623,753 B1 | 1/2014 | Yoshida et al. | |
| 8,643,185 B2 | 2/2014 | Kajiwara et al. | |
| 8,710,649 B1 | 4/2014 | Huemoeller et al. | |
| 8,927,334 B2 | 1/2015 | Daubenspeck et al. | |
| 9,070,677 B2 * | 6/2015 | Park ........................ | H01L 23/50 |
| 9,105,613 B1 | 8/2015 | Chen et al. | |
| 9,144,183 B2 | 9/2015 | Chen et al. | |
| 9,202,742 B1 | 12/2015 | Kim et al. | |
| 9,305,854 B2 | 4/2016 | Shim et al. | |
| 9,337,073 B2 | 5/2016 | Liu et al. | |
| 9,406,533 B2 | 8/2016 | Chi et al. | |
| 9,576,922 B2 | 2/2017 | Brunschwiler et al. | |
| 9,698,075 B2 | 7/2017 | Venugopal et al. | |
| 9,780,071 B2 | 10/2017 | Lee et al. | |
| 9,859,200 B2 | 1/2018 | Park et al. | |
| 9,916,989 B2 | 3/2018 | Yoon et al. | |
| 10,287,471 B2 | 5/2019 | Zhang et al. | |
| 10,322,472 B2 | 6/2019 | Hattori et al. | |
| 10,340,154 B2 | 7/2019 | Kamikoriyama et al. | |
| 10,421,123 B2 | 9/2019 | Jeong et al. | |
| 10,510,733 B2 | 12/2019 | Kumar et al. | |
| 10,566,104 B2 | 2/2020 | Lee et al. | |
| 10,600,743 B2 | 3/2020 | Lee et al. | |
| 10,784,181 B2 | 9/2020 | Fu et al. | |
| 10,854,549 B2 | 12/2020 | Nakano | |
| 10,867,936 B2 | 12/2020 | Wang et al. | |
| 10,872,879 B2 | 12/2020 | Kim et al. | |
| 11,437,308 B2 | 9/2022 | Rho et al. | |
| 11,652,060 B2 | 5/2023 | Gomes et al. | |
| 11,810,844 B2 | 11/2023 | Mok | |
| 12,388,029 B2 | 8/2025 | Yim et al. | |
| 2002/0104669 A1 | 8/2002 | Underwood et al. | |
| 2006/0007661 A1 | 1/2006 | Iketaki | |
| 2009/0096100 A1 | 4/2009 | Kajiwara et al. | |
| 2009/0152715 A1 | 6/2009 | Shim et al. | |
| 2010/0109688 A1 | 5/2010 | Eldridge et al. | |
| 2010/0129648 A1 | 5/2010 | Xu et al. | |
| 2011/0006425 A1 | 1/2011 | Wada et al. | |
| 2012/0018897 A1 | 1/2012 | Park et al. | |
| 2012/0132930 A1 | 5/2012 | Young et al. | |
| 2013/0056703 A1 | 3/2013 | Elian et al. | |
| 2013/0075923 A1 | 3/2013 | Park et al. | |
| 2013/0082364 A1 | 4/2013 | Wang et al. | |
| 2014/0024211 A1 | 1/2014 | Ott et al. | |
| 2014/0103527 A1 | 4/2014 | Mariumuthu et al. | |
| 2015/0179602 A1 | 6/2015 | Camacho et al. | |
| 2016/0039662 A1 | 2/2016 | Lin et al. | |
| 2016/0137507 A1 | 5/2016 | You et al. | |
| 2016/0286698 A1 | 9/2016 | Chang et al. | |
| 2017/0033086 A1 | 2/2017 | Homma et al. | |
| 2017/0130034 A1 | 5/2017 | Hwang et al. | |
| 2017/0167716 A1 | 6/2017 | Ezaki et al. | |
| 2018/0323170 A1 | 11/2018 | Kim et al. | |
| 2018/0346679 A1 | 12/2018 | Shishkin et al. | |
| 2019/0139902 A1 | 5/2019 | Lee et al. | |
| 2019/0181082 A1 | 6/2019 | Chen et al. | |
| 2019/0206839 A1 | 7/2019 | Balakrishnan et al. | |
| 2019/0259685 A1 | 8/2019 | Hussain et al. | |
| 2019/0348344 A1 | 11/2019 | Lu et al. | |
| 2019/0382627 A1 | 12/2019 | Hu et al. | |
| 2019/0394898 A1 | 12/2019 | Manninen et al. | |
| 2020/0002176 A1 | 1/2020 | Gorton | |
| 2020/0075502 A1 | 3/2020 | Kim et al. | |
| 2020/0161252 A1 | 5/2020 | Yang et al. | |
| 2020/0227338 A1 | 7/2020 | Gong | |
| 2020/0388552 A1 | 12/2020 | Chou et al. | |
| 2021/0005512 A1 | 1/2021 | Liu et al. | |
| 2021/0028122 A1 | 1/2021 | Son et al. | |
| 2021/0151357 A1 | 5/2021 | Cook et al. | |
| 2021/0257346 A1 | 8/2021 | Baloglu et al. | |
| 2022/0002157 A1 | 1/2022 | Corrigan et al. | |
| 2022/0066703 A1 | 3/2022 | Hayes | |
| 2022/0352398 A1 | 11/2022 | Mushi et al. | |
| 2022/0359418 A1 | 11/2022 | Jung et al. | |
| 2023/0320106 A1 | 10/2023 | Mun | |
| 2023/0323067 A1 | 10/2023 | Yoshida et al. | |
| 2024/0096736 A1 | 3/2024 | Shin et al. | |
| 2024/0128200 A1 * | 4/2024 | Shin ................... | H01L 23/3121 |
| 2024/0153783 A1 | 5/2024 | Lee et al. | |
| 2024/0194628 A1 | 6/2024 | Shin et al. | |
| 2024/0194629 A1 | 6/2024 | Shin et al. | |
| 2024/0213328 A1 | 6/2024 | Bejugam et al. | |
| 2024/0234291 A1 | 7/2024 | Shin et al. | |
| 2024/0234292 A1 | 7/2024 | Shin et al. | |
| 2024/0312884 A1 | 9/2024 | Shin et al. | |
| 2024/0332035 A1 | 10/2024 | Shin et al. | |
| 2024/0413095 A1 | 12/2024 | Shin et al. | |

FOREIGN PATENT DOCUMENTS

| | | |
|---|---|---|
| KR | 10-2395247 | 5/2022 |
| TW | 202134169 A | 9/2021 |
| WO | 2022113729 A1 | 6/2022 |

OTHER PUBLICATIONS

Yu Seong Lee, Laser-Sintered Silver Nanoparticles as a Die Adhesive Layer for High-Power Light-Emitting Diodes, IEEE Transactions on Components, Packaging and Manufacturing Technology. vol. 4, No. 7, Jul. 2014, pp. 1119-1124.

* cited by examiner

SEMICONDUCTOR DEVICE AND METHOD OF PARTIAL SHIELDING WITH EMBEDDED GRAPHENE CORE SHELLS

FIELD OF THE INVENTION

The present invention relates in general to semiconductor devices and, more particularly, to a semiconductor device and method of forming a shielding layer with graphene core shells embedded between a first encapsulant and a second encapsulant.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are disposed on a substrate for structural support and electrical interconnect. An encapsulant is deposited over the semiconductor die, IPDs, and substrate.

The SIP module includes high speed digital and RF electrical components, highly integrated for small size and low height, and operating at high clock frequencies and high power rating. An electromagnetic shielding material is commonly conformally applied over the encapsulant. The electromagnetic shielding material reduces or inhibits electromagnetic interference (EMI), radio frequency interference (RFI), and other inter-device interference, for example as radiated by high-speed digital devices, from affecting neighboring devices within or adjacent to SiP module.

The shielding material can be made with copper (Cu) as a cost-effective material with reasonable electrical conductivity. Unfortunately, Cu shielding is subject to oxidation in the atmosphere. A shielding layer robust to the environment with even better electrical conductivity is desired.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
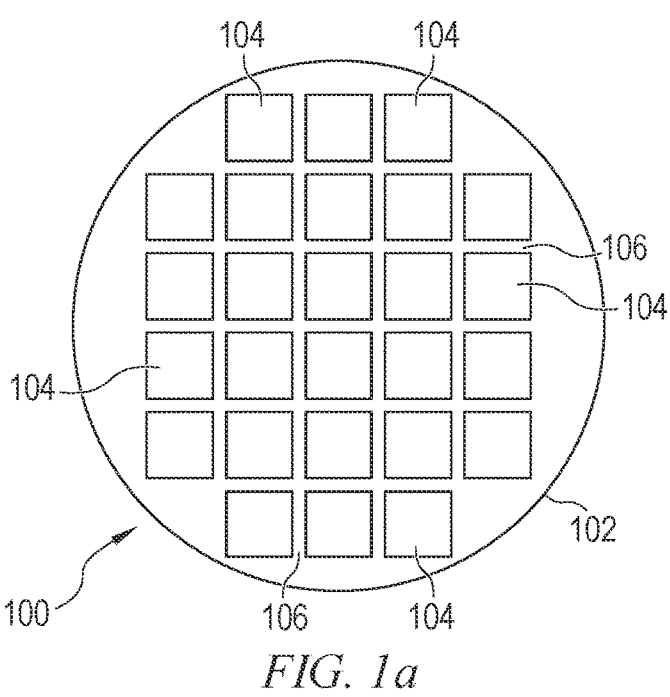
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Alternatively, wafer 100 can be a mold surface, organic or inorganic substrate, or target substrate suitable for graphene transfer.

Figure 1B:
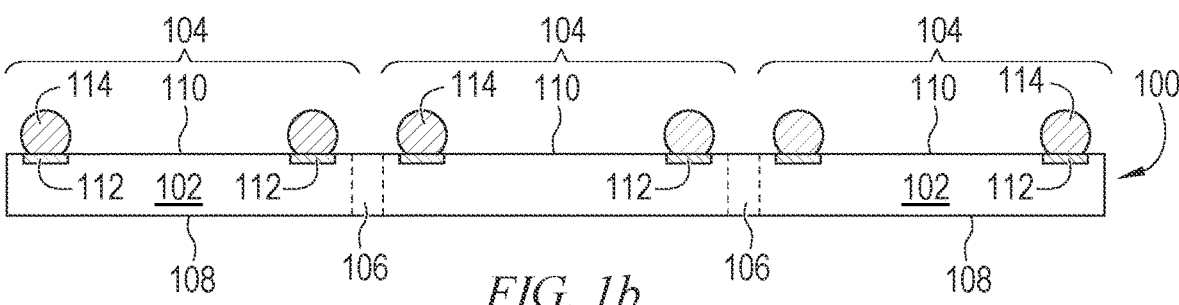

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
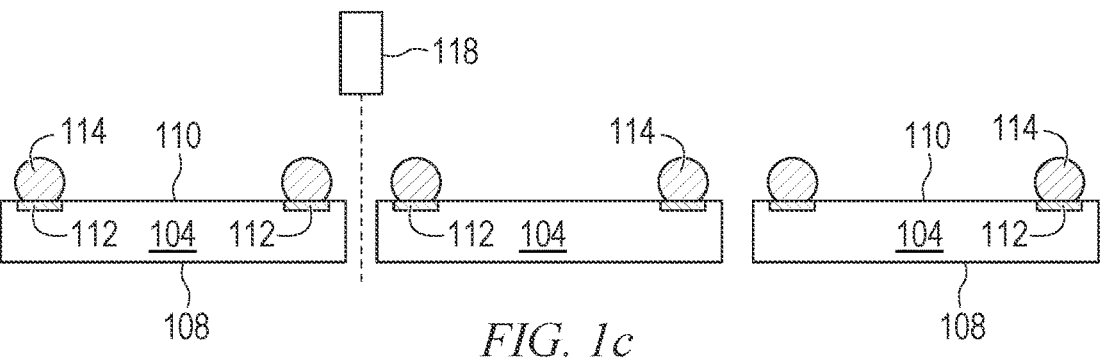

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B, 2C:
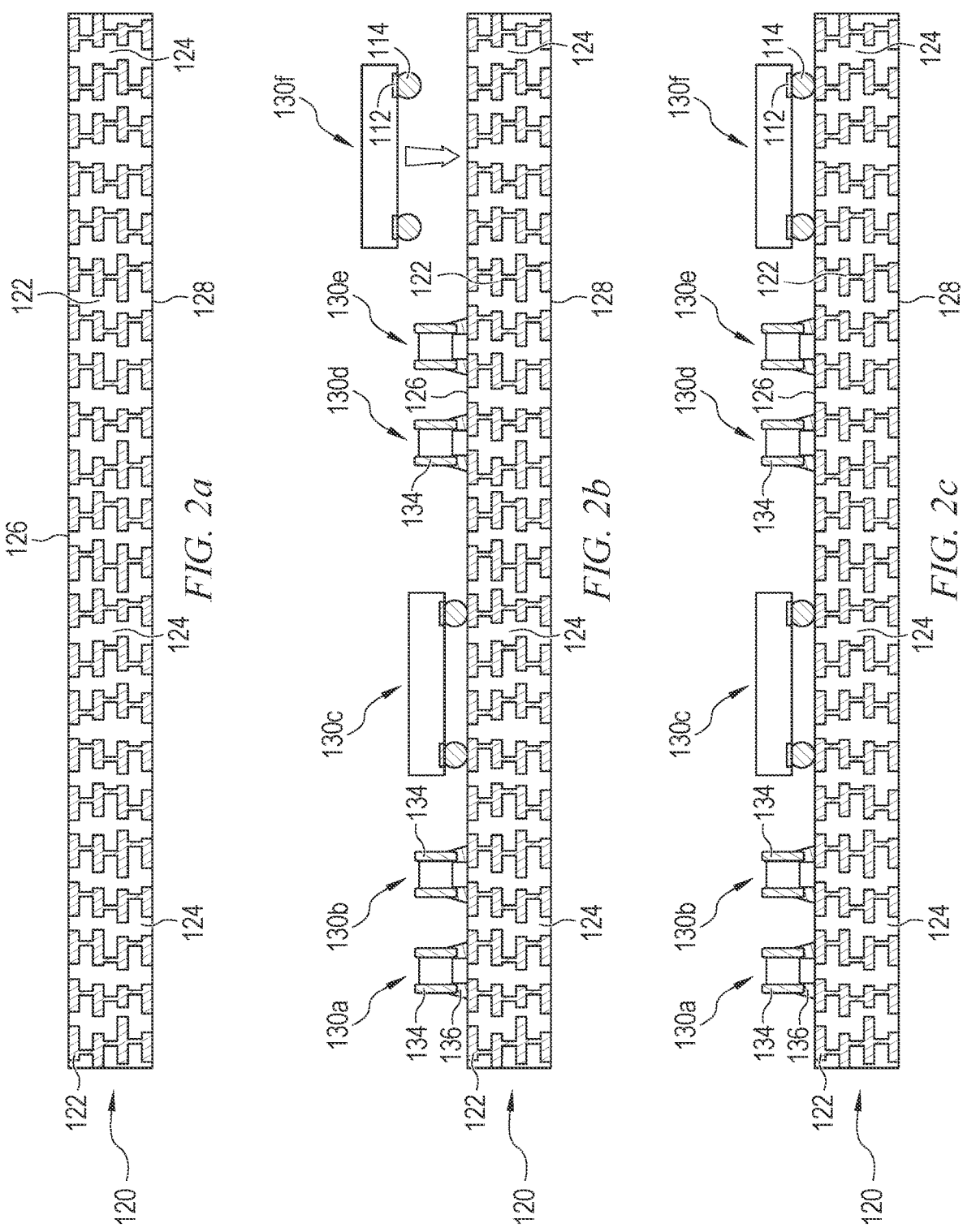
FIGS. 2a-2l illustrate a process of forming a shielding layer with graphene core shells embedded between a first encapsulant and second encapsulant layers.

FIGS. 2*a*-21 illustrate a process of forming a shielding layer with graphene core shells embedded between two encapsulant layers for an Sip to reduce or inhibit the effects of EMI, RFI, and other inter-device interference. FIG. 2*a* shows a cross-sectional view of multi-layered interconnect substrate 120 including conductive layers 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layer 124 provides isolation between conductive layers 122.

In FIG. 2*b*, electrical components 130*a*-130*f* are disposed on surface 126 of interconnect substrate 120 and electrically and mechanically connected to conductive layers 122. For example, electrical components 130*a*, 130*b*, 130*d*, and 130*e* can be discrete electrical devices, or IPDs, such as a diode, transistor, resistor, capacitor, and inductor. Electrical components 130 and 130*f* can be, or made similar to, semiconductor die 104 from FIG. 1*c* with bumps 114 oriented toward surface 126 of substrate 120. Alternatively, electrical components 130*a*-130*f* can include other semiconductor die, semiconductor packages, surface mount devices, RF components, discrete electrical devices, or integrated passive devices (IPD).

Electrical components 130*a*-130*f* are positioned over substrate 120 using a pick and place operation. Electrical components 130*a*-130*f* are brought into contact with conductive layer 122 on surface 126 of substrate 120. Terminals 134 of electrical components 130*a*, 130*b*, 130*d*, and 130*e* are electrically and mechanically connected to conductive layer 122 using solder or conductive paste 136. Electrical components 130*a* and 130*f* are electrically and mechanically connected to conductive layer 122 by reflowing bumps 114. FIG. 2*c* illustrates electrical components 130*a*-130*f* electrically and mechanically connected to conductive layers 122 of substrate 120.

Figures 2D, 2E:
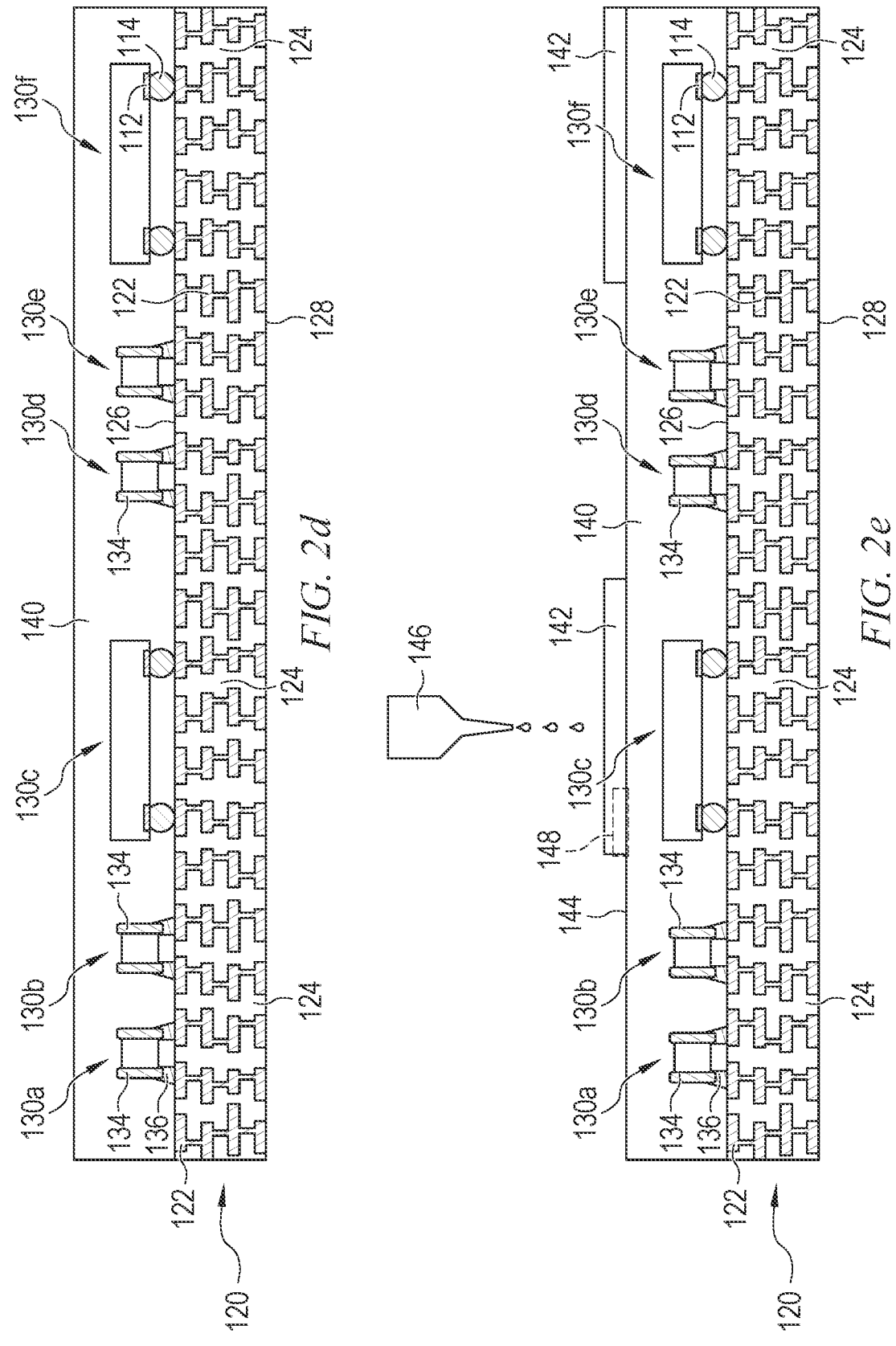
Figure 2F:
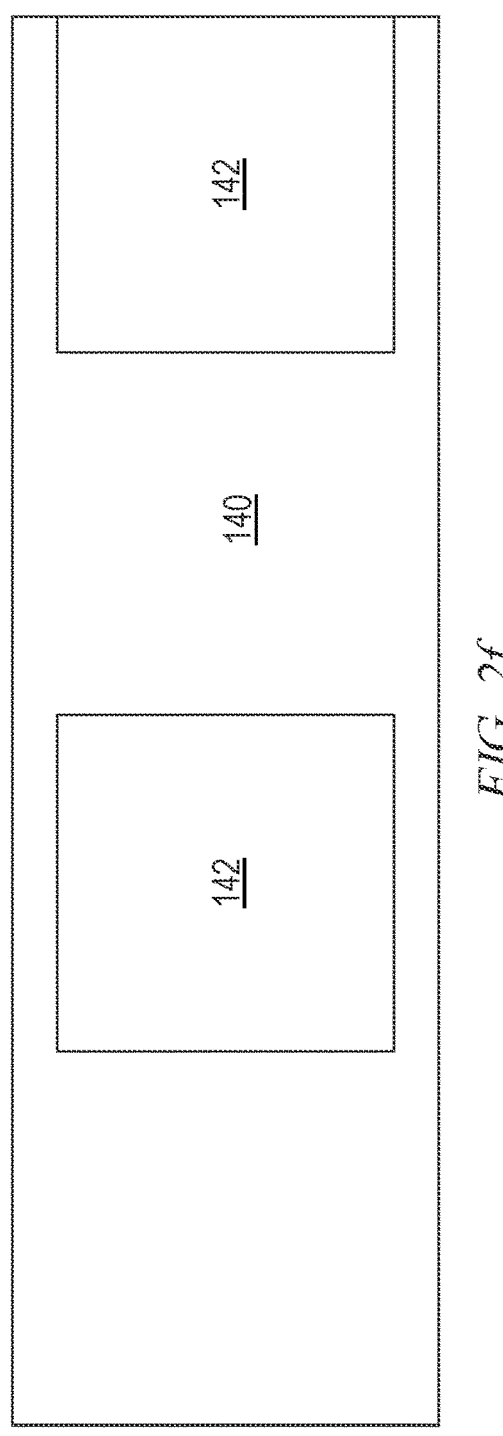
Figure 2G:
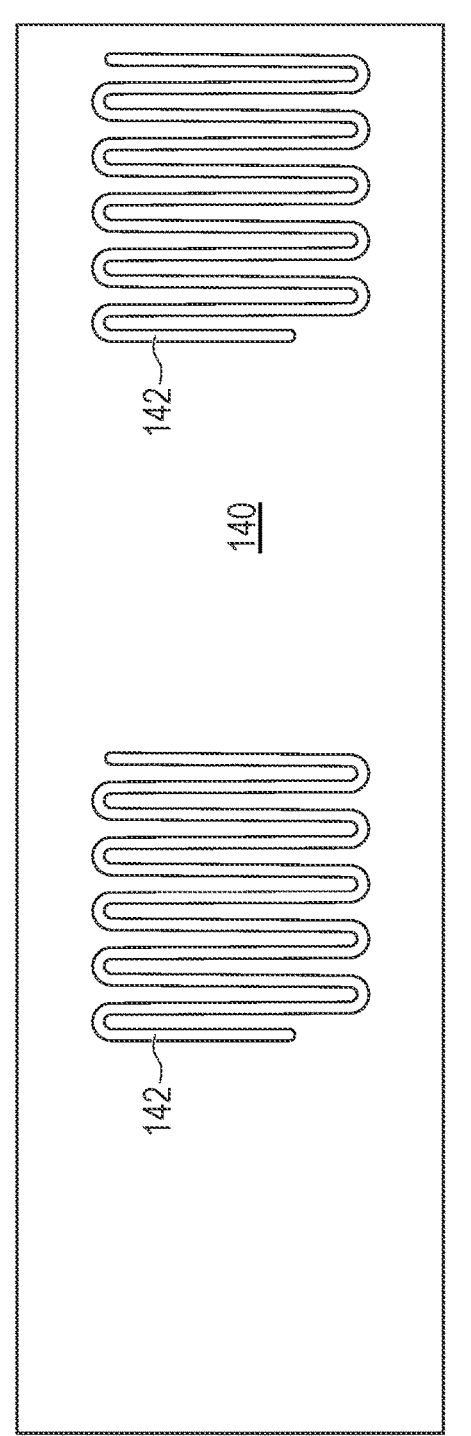

In FIG. 2*d*, encapsulant or molding compound 140 is deposited over and around electrical components 130*a*-130*f* and substrate 120 using a paste printing, compressive molding, transfer molding, liquid encapsulant molding, vacuum lamination, spin coating, or other suitable applicator. Encapsulant 140 can be liquid or granular polymer composite material, such as epoxy resin with filler, epoxy acrylate with filler, or polymer with proper filler. Encapsulant 140 is non-conductive, provides structural support, and environmentally protects the semiconductor device from external elements and contaminants.

Electrical components 130*a*-130*f* may contain IPDs that are susceptible to or generate EMI, RFI, harmonic distortion, and inter-device interference. For example, the IPDs contained within electrical components 130*a*-130*f* provide the electrical characteristics needed for high-frequency applications, such as resonators, high-pass filters, low-pass filters, band-pass filters, symmetric Hi-Q resonant transformers, and tuning capacitors. In another embodiment, electrical components 130*a*-130*f* contain digital circuits switching at a high frequency, which could interfere with the operation of other IPDs.

To address EMI, RFI, harmonic distortion, and inter-device interference and continuing from FIG. 2*c*, a partial shielding material or layer 142 is deposited, printed, or otherwise formed on surfaces 144 of encapsulant 140, as shown in FIG. 2*e*. Shielding material 142 is a partial shielding layer as it is formed only over electrical components 130c and 130f to reduce or inhibit the effects of EMI, RFI, and other inter-device interference from those devices. In one embodiment, shielding layer 142 is printed or dispensed on surface 144 with printer or dispenser 146. Further detail of applying shielding layer 142 is described in FIGS. 8a, 8b, and 9. Shielding layer 142 can be a solid rectangular body, as shown in top view of FIG. 2f, or a continuous serpentine segment extending in one or more x-direction channels and one or more y-direction channels, see top view of FIG. 2g. Shielding layer 142 can be one or more layers of a matrix, such as thermal set material or polymer, with graphene covered cores embedded within the matrix, see further description in FIGS. 6a-6b and 7a-7c. Alternatively, shielding layer 142 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground.

Figures 2H, 2I:
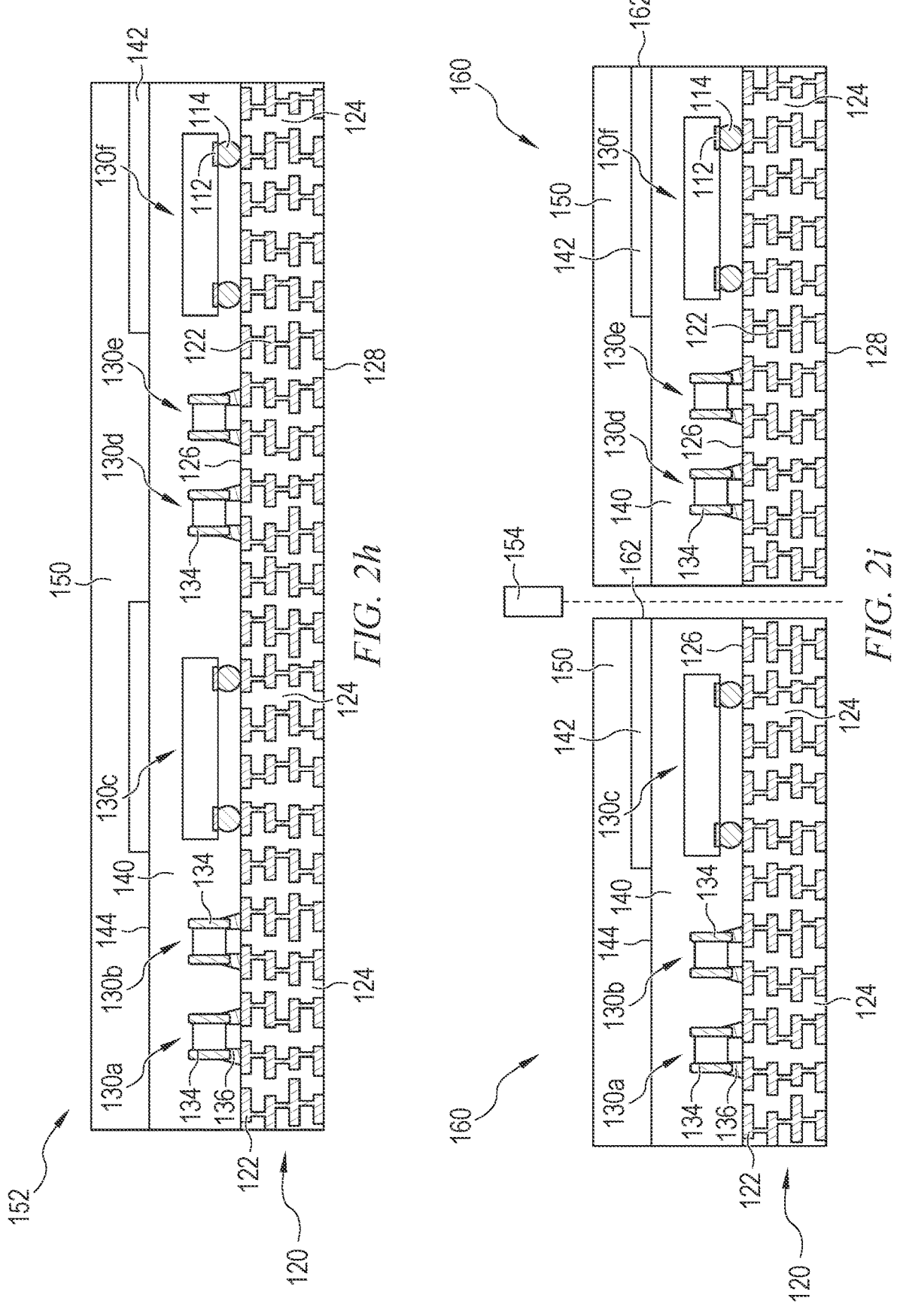

In FIG. 2h, encapsulant or molding compound 150 is deposited over surface 144 of encapsulant 140 and over partial shielding layer 142 using a paste printing, compressive molding, transfer molding, liquid encapsulant molding, vacuum lamination, spin coating, or other suitable applicator. Encapsulant 150 can be liquid or granular polymer composite material, such as epoxy resin with filler, epoxy acrylate with filler, or polymer with proper filler. Encapsulant 150 is non-conductive, provides structural support, and environmentally protects the semiconductor device from external elements and contaminants.

Substrate 120, electrical components 130a-130f, and partial shielding layer 142 constitute reconstituted wafer or panel 152. In FIG. 2i, reconstituted wafer or panel 152 is singulated using saw blade or laser cutting tool 154 into individual semiconductor packages 160.

Figure 2J:
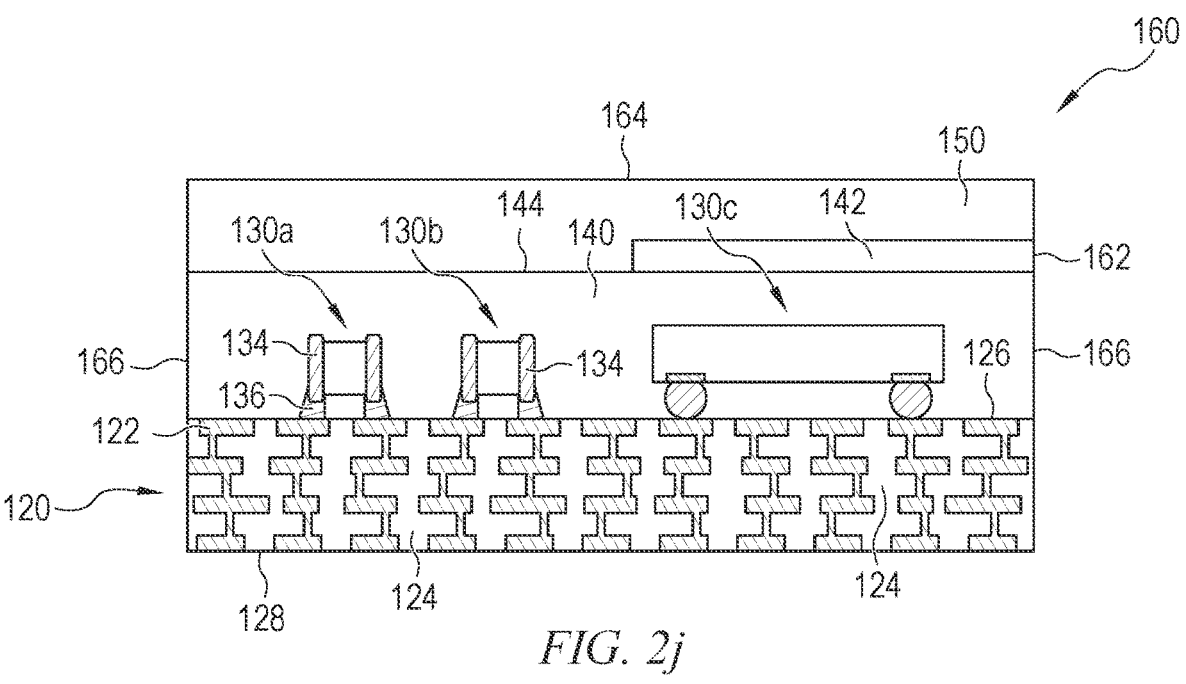
Figure 2K:
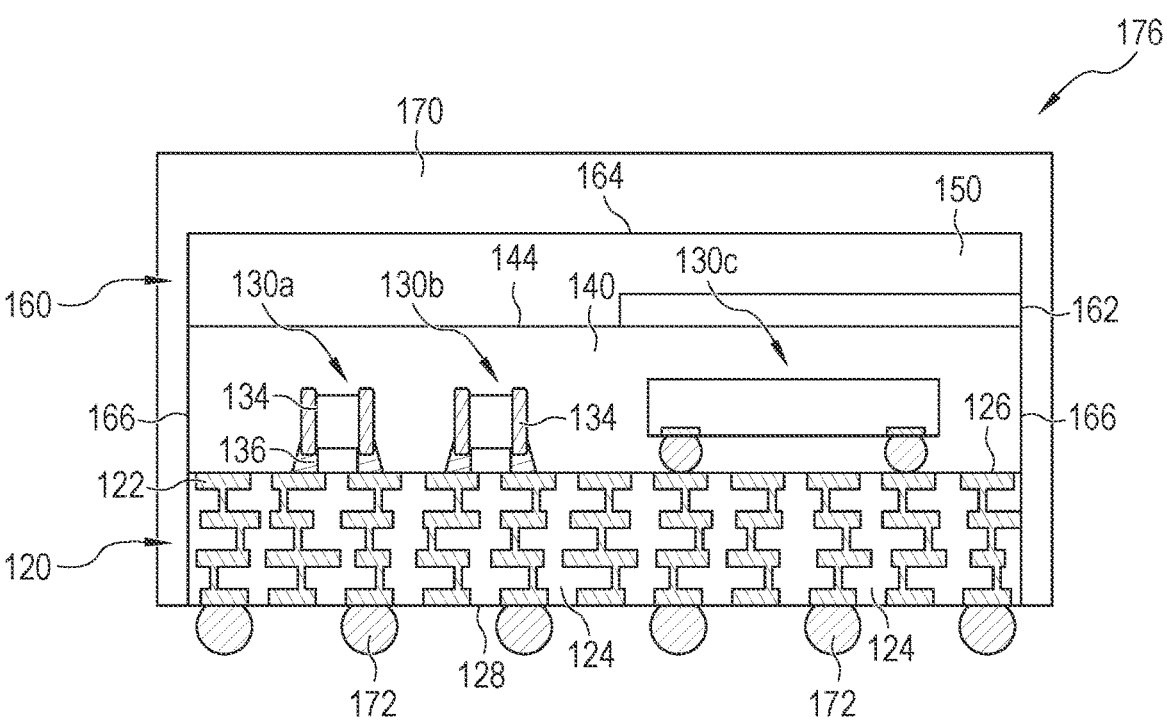

FIG. 2j illustrates semiconductor package 160 post singulation. The singulation exposes at least side surface 162 of shielding layer 142. In FIG. 2k, shielding layer 170 is deposited, printed, or otherwise formed on surface 164 of encapsulant 150. Shielding layer 170 extends down side surfaces 166 and contacts side surface 162 and conductive layer 122. Shielding layer 170 can be one or more layers of a matrix, such as thermal set material or polymer, with graphene covered cores embedded within the matrix, see further description in FIGS. 6a-6b and 7a-7c. Alternatively, shielding layer 170 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground. Shielding layer 142 and 170 are grounded through interconnect substrate 120.

An electrically conductive bump material is deposited over conductive layer 122 on surface 128 of substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 172. In one embodiment, bump 172 is formed over a UBM having a wetting layer, barrier layer, and adhesive layer. Bump 172 can also be compression bonded or thermocompression bonded to conductive layer 122. In one embodiment, bump 172 is a copper core bump for durability and maintaining its height. Bump 172 represents one type of interconnect structure that can be formed over conductive layer 122. The interconnect structure can also use bond wires, conductive paste, stud bump, micro bump, or other electrical interconnect.

Figure 2L:
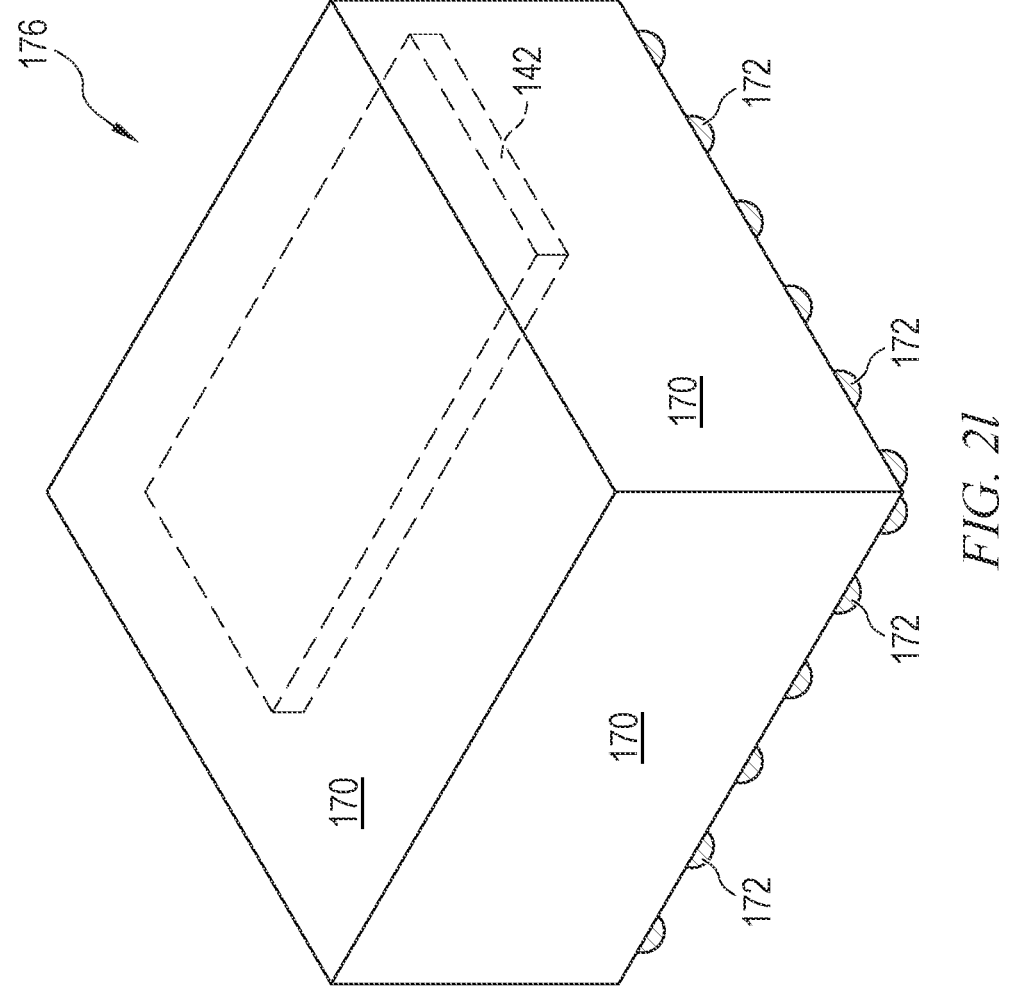

The combination of substrate 120, electrical components 130a-130c, encapsulants 140 and 150, and shielding layers 142 and 170 constitutes system-in-package (SiP) 176. FIG. 2l is a perspective view of SiP 176 with shielding layer 170 and partial shielding layer 142 between encapsulants 140 and 150.

Figures 3A, 3B:
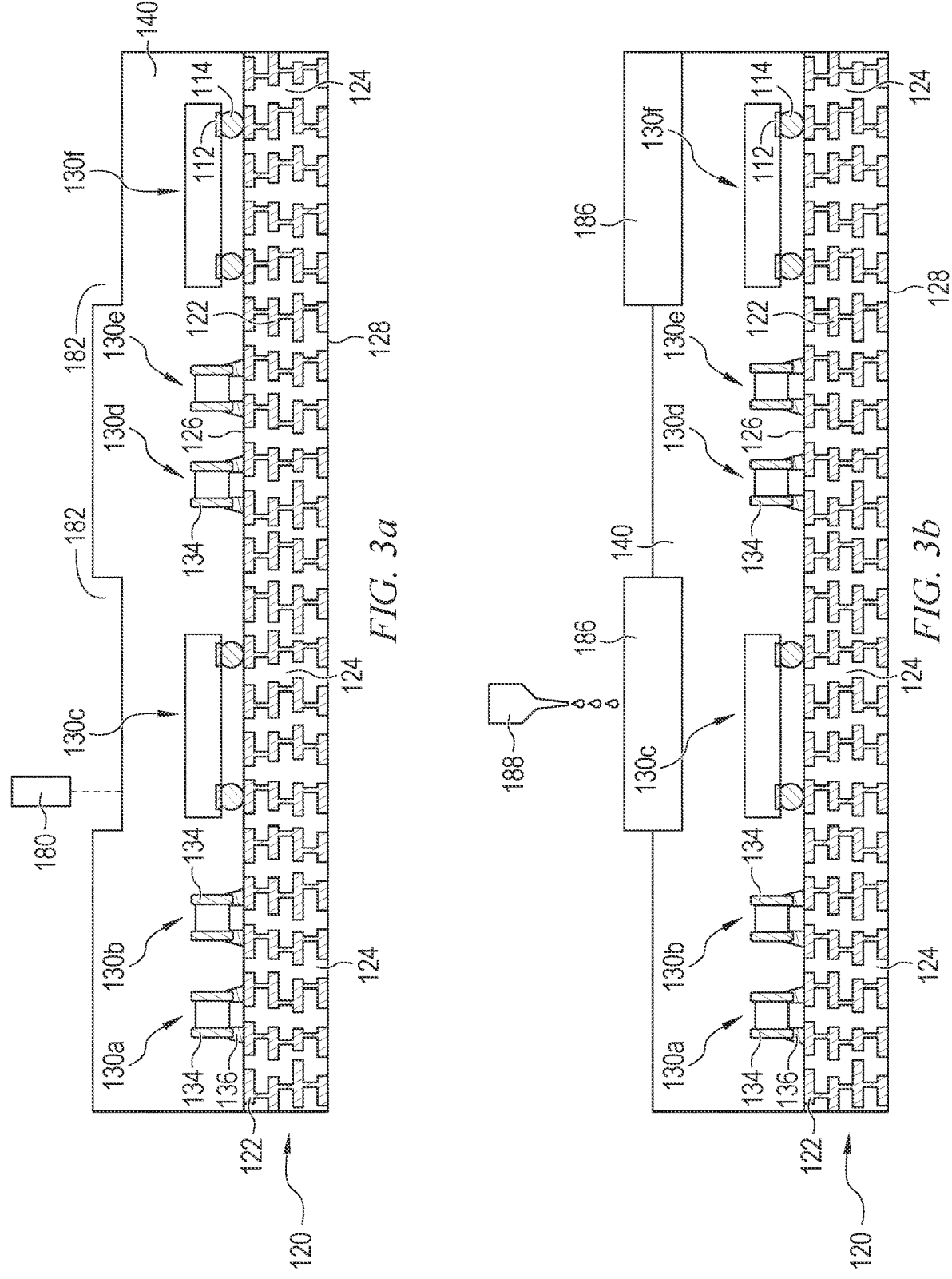
FIGS. 3a-3f illustrate a process of forming an opening in a first encapsulant to partially contain the shielding layer.

In another embodiment, continuing from FIG. 2d, a portion of encapsulant 140 is removed using an etching process or laser direct ablation (LDA) with laser 180, leaving opening or channel 182, as shown in FIG. 3a. Channel 182 can be rectangular or a slot or channel extending in one or more x-direction channels and one or more y-direction channels. In FIG. 3b, partial shielding material or layer 186 is deposited in opening or channel 182. Shielding layer 186 is a partial shielding layer as it is formed over electrical components 130c and 130f to reduce or inhibit the effects of EMI, RFI, and other inter-device interference from those devices. In one embodiment, shielding material 186 is printed or dispensed in openings or channels 182 with printer or dispenser 188. Further detail of applying shielding layer 186 is described in FIGS. 8a, 8b, and 9. Shielding layer 186 can be a solid rectangular body, similar to FIG. 2f, or a continuous serpentine segment extending in one or more x-direction channels and one or more y-direction channels, similar to FIG. 2g. Shielding layer 186 can be one or more layers of a matrix, such as thermal set material or polymer, with graphene covered cores embedded within the matrix, see further description in FIGS. 6a-6b and 7a-7c. Alternatively, shielding layer 186 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground.

Figures 3C, 3D:
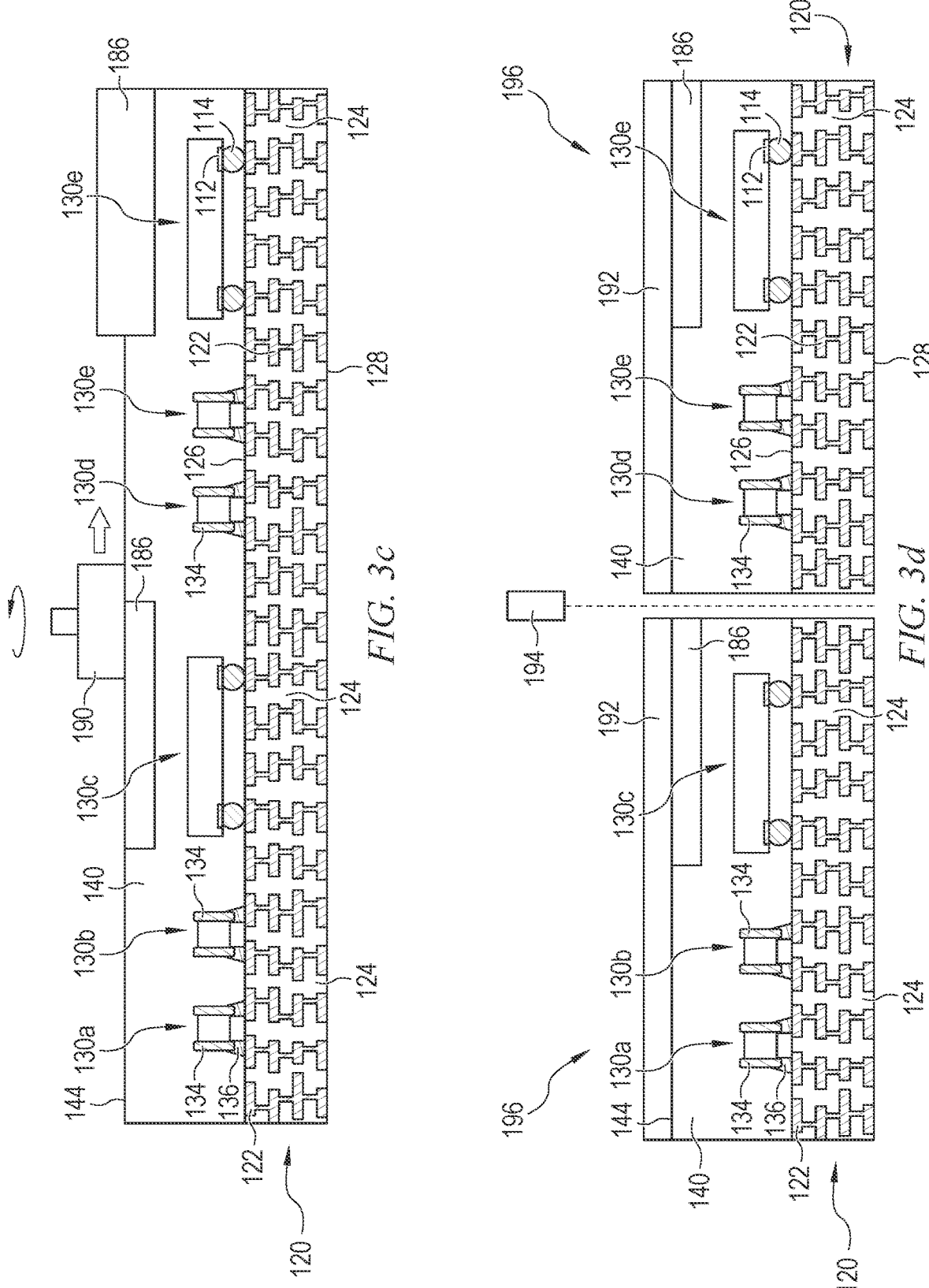

In FIG. 3c, a portion of encapsulant 140 and shielding layer 186 is removed by grinder 190 to planarize surface 144 of the encapsulant and shielding layer 186.

In FIG. 3d, encapsulant or molding compound 192 is deposited over surface 144 of encapsulant 140 and over partial shielding layer 186 using a paste printing, compressive molding, transfer molding, liquid encapsulant molding, vacuum lamination, spin coating, or other suitable applicator, similar to FIG. 2h. Encapsulant 192 can be liquid or granular polymer composite material, such as epoxy resin with filler, epoxy acrylate with filler, or polymer with proper filler. Encapsulant 192 is non-conductive, provides structural support, and environmentally protects the semiconductor device from external elements and contaminants. The reconstituted wafer or panel is singulated using saw blade or laser cutting tool 194 into individual semiconductor packages 196.

Figure 3E:
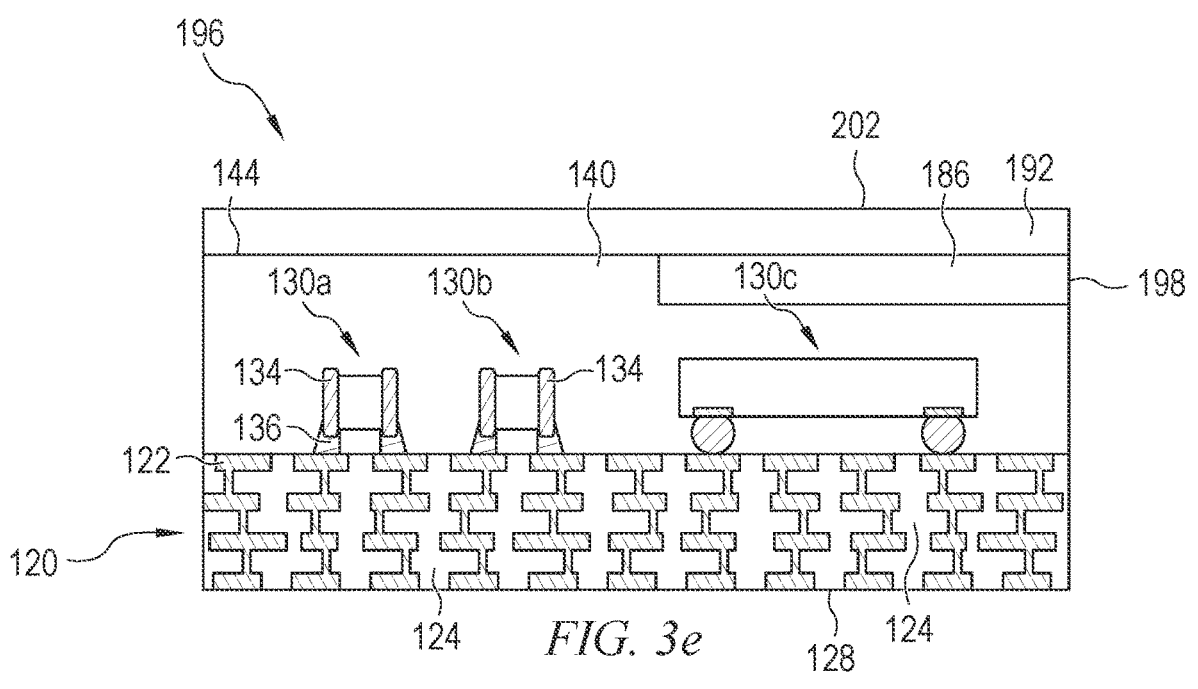
Figure 3F:
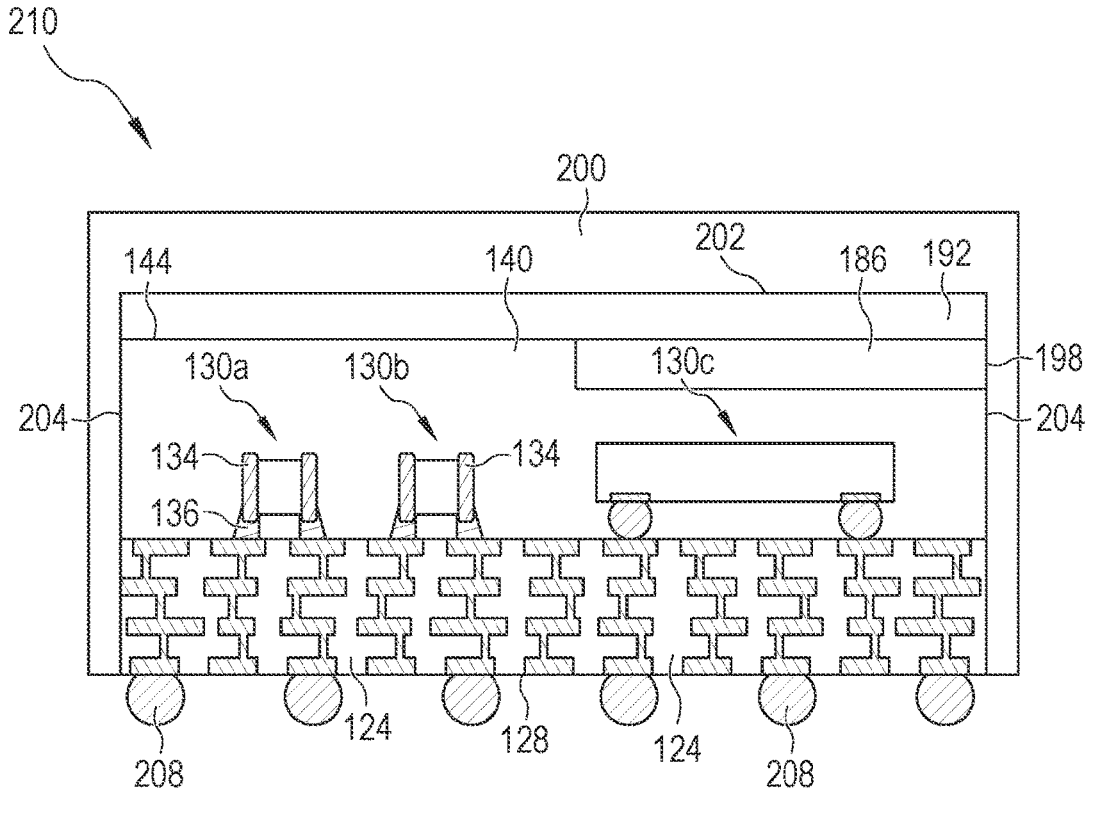

FIG. 3e illustrates semiconductor package 196 post singulation. The singulation exposes at least side surface 198 of shielding layer 186. In FIG. 3f, shielding layer 200 is deposited, printed, or otherwise formed on surface 202 of encapsulant 192. Shielding layer 200 extends down side surfaces 204 and contacts side surface 198 and conductive layer 122. Shielding layer 200 can be one or more layers of a matrix, such as thermal set material or polymer, with graphene covered cores embedded within the matrix, see further description in FIGS. 8a, 8b, and 9. Alternatively, shielding layer 200 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground. Shielding layer 186 and 200 are grounded through interconnect substrate 120.

An electrically conductive bump material is deposited over conductive layer 122 on surface 128 of substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 208. In one embodiment, bump 208 is formed over a UBM having a wetting layer, barrier layer, and adhesive layer. Bump 208 can also be compression bonded or thermocompression bonded to conductive layer 122. In one embodiment, bump 208 is a copper core bump for durability and maintaining its height. Bump 208 represents one type of interconnect structure that can be formed over conductive layer 122. The interconnect structure can also use bond wires, conductive paste, stud bump, micro bump, or other electrical interconnect.

The combination of substrate 120, electrical components 130a-130c, encapsulants 140 and 192, and shielding layers 186 and 200 constitutes SiP 210. A perspective view of SiP 210 with shielding layer 200 and partial shielding layer 186 between encapsulants 140 and 192 would be similar to FIG. 2l.

Figure 4A:
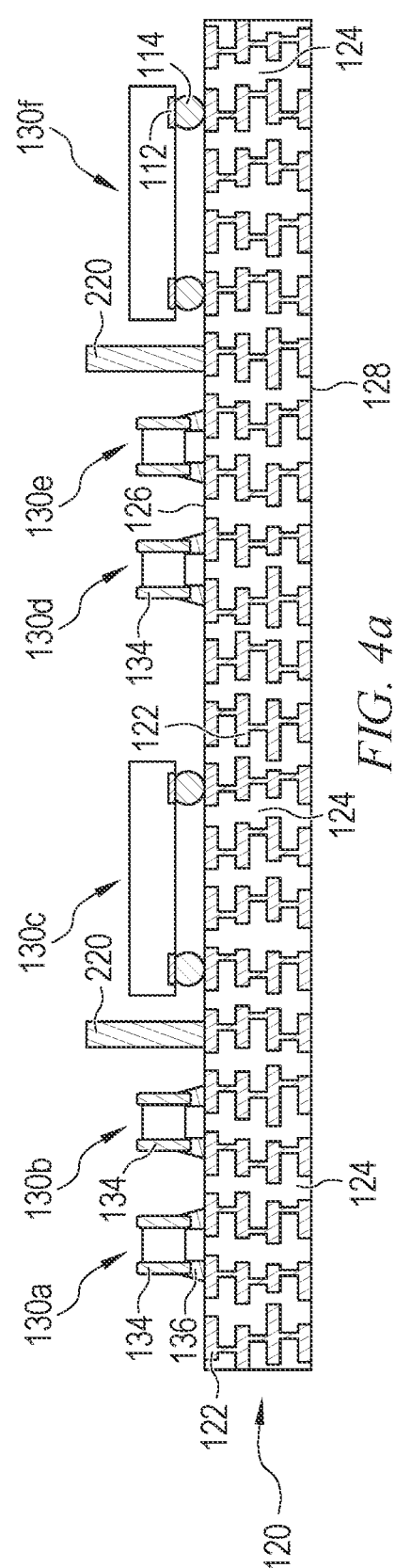
FIGS. 4a-4g illustrate a process of forming a conductive post contacting the shielding layer.

In another embodiment, continuing from FIG. 2a, a plurality of conductive posts 220 is formed on surface 126 of substrate 120 with electrical connection to conductive layer 122, as shown in FIG. 4a. In one example, a photoresist material (not shown) is applied to surface 126. A plurality of openings is formed in the photoresist at the locations for the conductive posts using an etching or LDA process. Conductive material is deposited in the openings and the photoresist is removed leaving conductive posts 220. Conductive post 220 can be a metal bar or frame and be attached on the substrate by solder. Electrical components 130a-130f are disposed on surface 126, as described in FIGS. 2b-2c. Conductive posts 220 can be formed after disposing electrical component 130a-130f on surface 126.

Figure 4B:
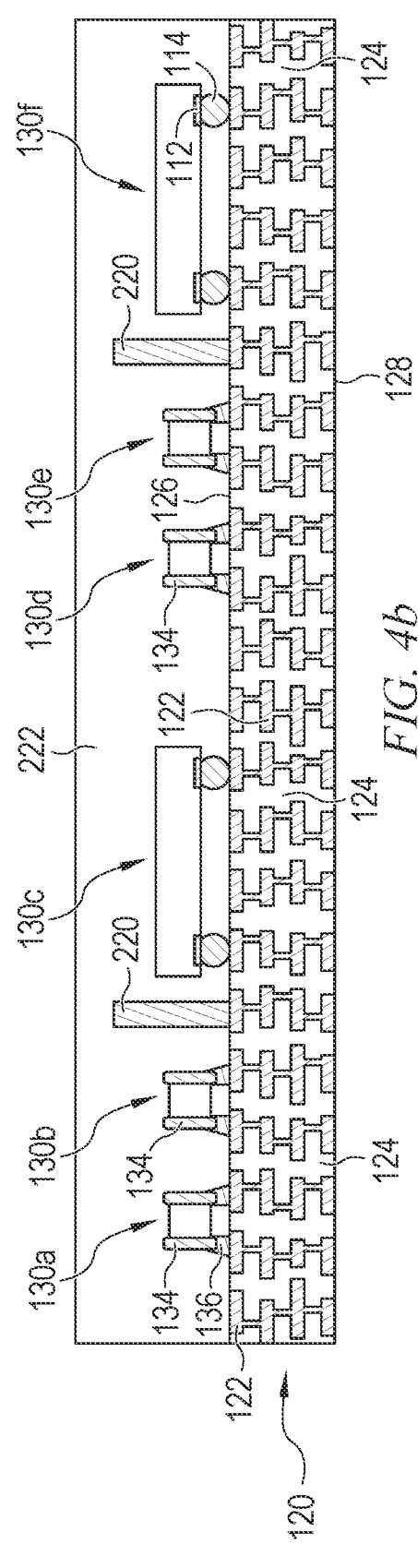

In FIG. 4b, encapsulant or molding compound 222 is deposited over and around electrical components 130a-130c and substrate 120 using a paste printing, compressive molding, transfer molding, liquid encapsulant molding, vacuum lamination, spin coating, or other suitable applicator. Encapsulant 222 can be liquid or granular polymer composite material, such as epoxy resin with filler, epoxy acrylate with filler, or polymer with proper filler. Encapsulant 222 is non-conductive, provides structural support, and environmentally protects the semiconductor device from external elements and contaminants.

Figures 4C, 4D:
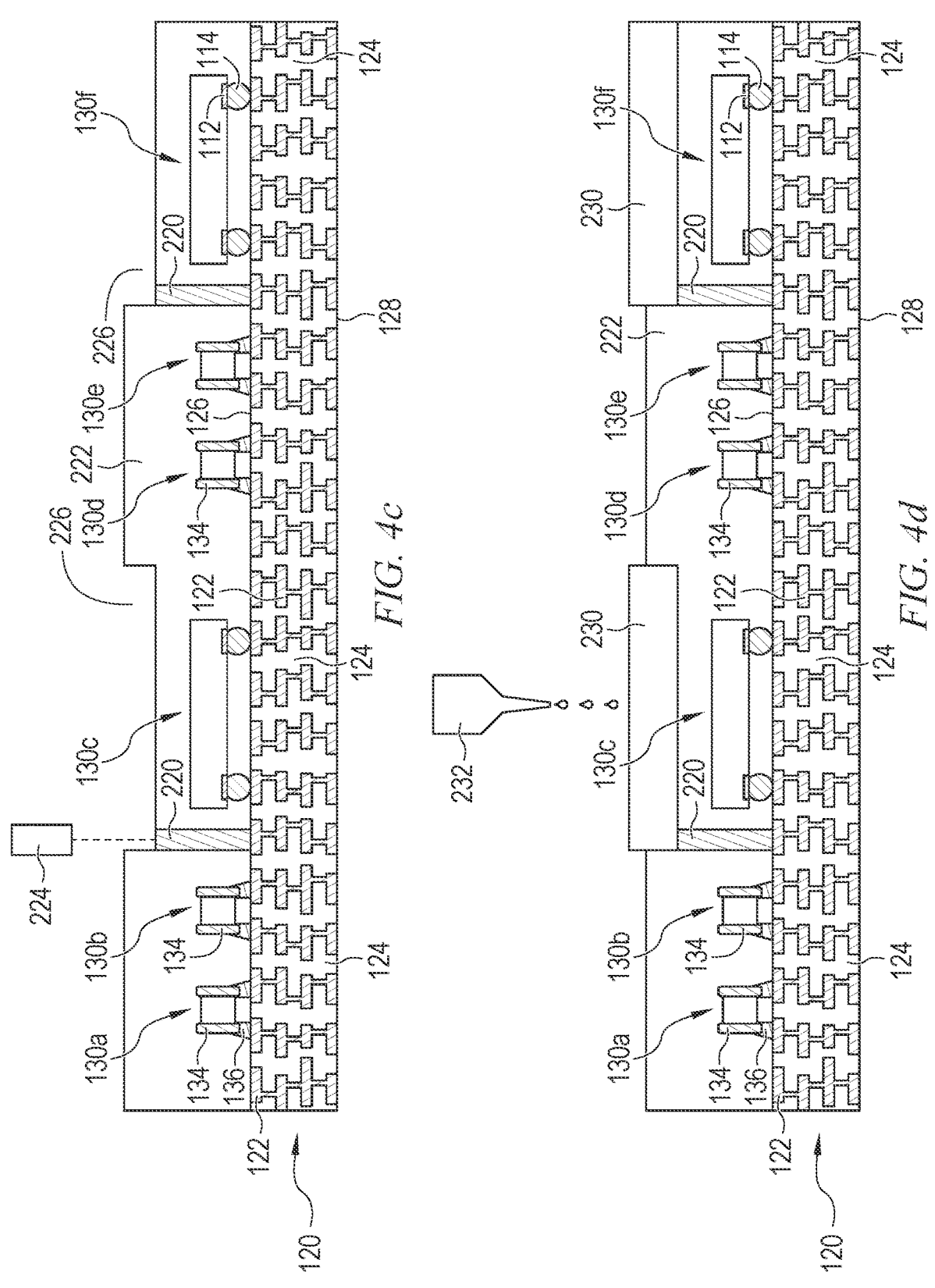

In FIG. 4c, a portion of encapsulant 222 is removed using an etching process or LDA with laser 224, exposing conductive posts 220 and leaving opening or channel 226. Channel 226 can be rectangular or a slot extending in one or more x-direction channels and one or more y-direction channels. In FIG. 4d, partial shielding material or layer 230 is deposited in opening or channel 226. Shielding layer 230 is a partial shielding layer as it is formed over electrical components 130c and 130f to reduce or inhibit the effects of EMI, RFI, and other inter-device interference from those devices. In one embodiment, shielding material 230 is printed or dispensed in openings or channels 226 with printer or dispenser 232. Further detail of applying shielding layer 230 is described in FIGS. 8a, 8b, and 9. Shielding layer 230 can be a solid rectangular body, similar to FIG. 2f, or a continuous serpentine segment extending in one or more x-direction channels and one or more y-direction channels, similar to FIG. 2g. Shielding layer 230 makes electrical connection to conductive posts 220. Shielding layer 230 can be one or more layers of a matrix, such as thermal set material or polymer, with graphene covered cores embedded within the matrix, see further description in FIGS. 6a-6b and 7a-7c. Alternatively, shielding layer 230 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground.

Figures 4E, 4F:
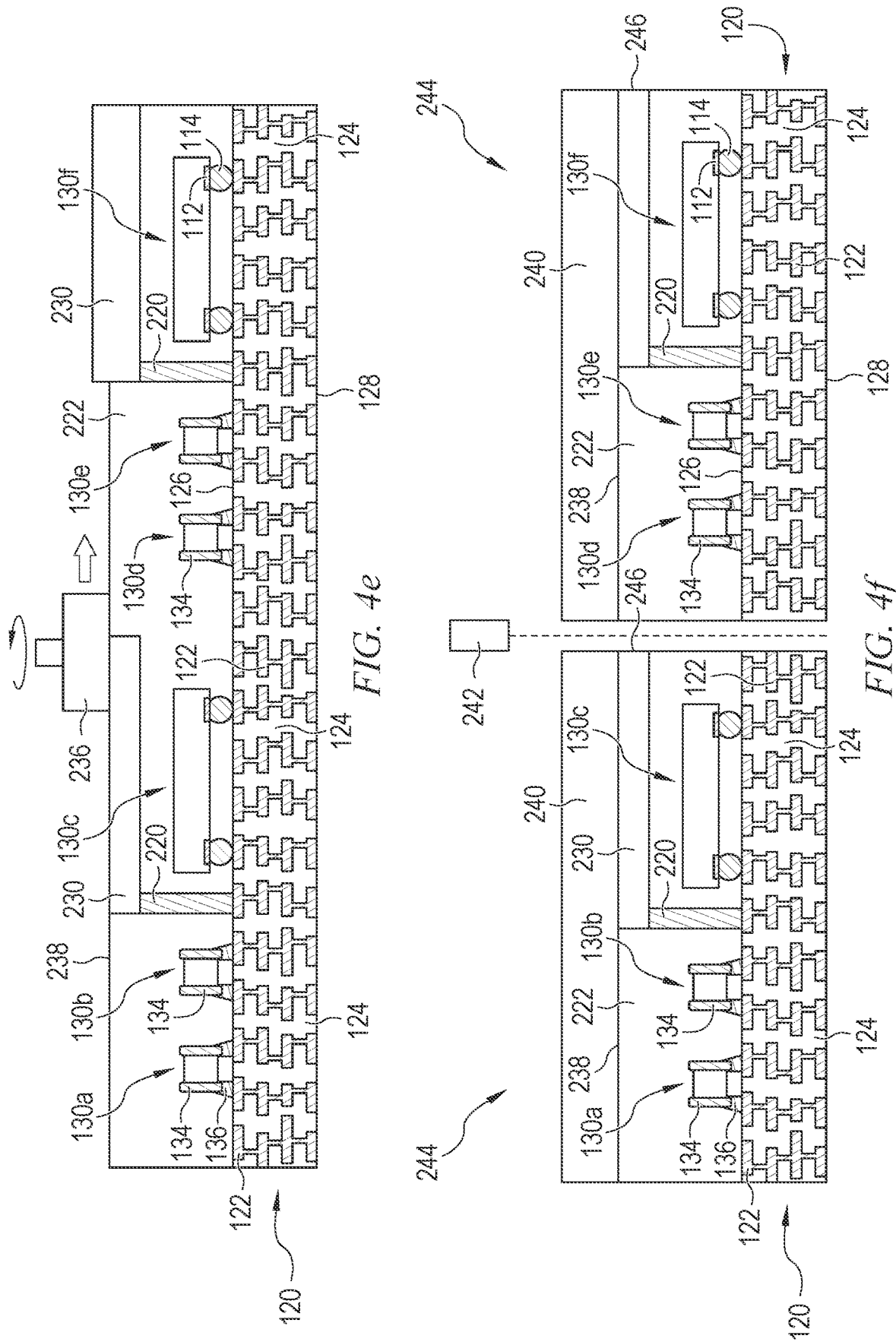

In FIG. 4e, a portion of encapsulant 222 and shielding layer 230 is removed by grinder 236 to planarize surface 238 of the encapsulant and shielding layer 230.

In FIG. 4f, encapsulant or molding compound 240 is deposited over surface 238 of encapsulant 222 and over partial shielding layer 230 using a paste printing, compressive molding, transfer molding, liquid encapsulant molding, vacuum lamination, spin coating, or other suitable applicator, similar to FIG. 2h. Encapsulant 240 can be liquid or granular polymer composite material, such as epoxy resin with filler, epoxy acrylate with filler, or polymer with proper filler. Encapsulant 240 is non-conductive, provides structural support, and environmentally protects the semiconductor device from external elements and contaminants. The reconstituted wafer or panel is singulated using saw blade or laser cutting tool 242 into individual semiconductor packages 244. The singulation exposes at least side surface 246 of shielding layer 230.

Figure 4G:
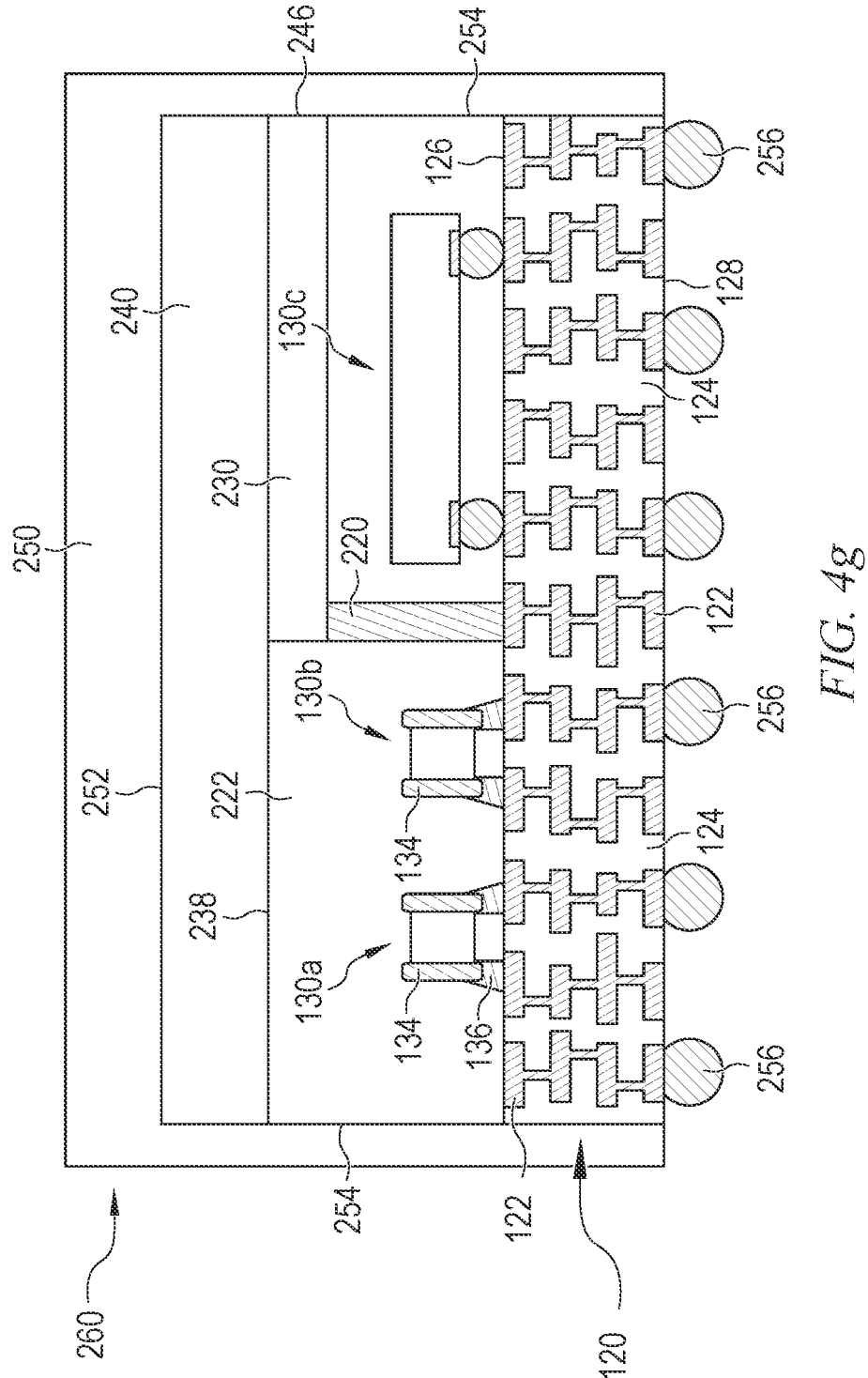

In FIG. 4g, shielding layer 250 is deposited, printed, or otherwise formed on surface 252 of encapsulant 240. Shielding layer 250 extends down side surfaces 254 and contacts side surface 246 and conductive layer 122. Shielding layer 250 can be one or more layers of a matrix, such as thermal set material or polymer, with graphene covered cores embedded within the matrix, see further description in FIGS. 6a-6b and 7a-7c. Alternatively, shielding layer 250 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground. Shielding layer 230 and 250 are grounded through conductive post 220 and interconnect substrate 120.

An electrically conductive bump material is deposited over conductive layer 122 on surface 128 of substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 256. In one embodiment, bump 256 is formed over a UBM having a wetting layer, barrier layer, and adhesive layer. Bump 256 can also be compression bonded or thermocompression bonded to conductive layer 122. In one embodiment, bump 256 is a copper core bump for durability and maintaining its height. Bump 256 represents one type of interconnect structure that can be formed over conductive layer 122. The interconnect structure can also use bond wires, conductive paste, stud bump, micro bump, or other electrical interconnect.

The combination of substrate 120, electrical components 130a-130c, encapsulants 222 and 240, and shielding layers 230 and 250 constitutes SiP 260. A perspective view of SiP 260 with shielding layer 250 and partial shielding layer 230 between encapsulants 222 and 240 would be similar to FIG. 2l.

Figures 5A, 5B:
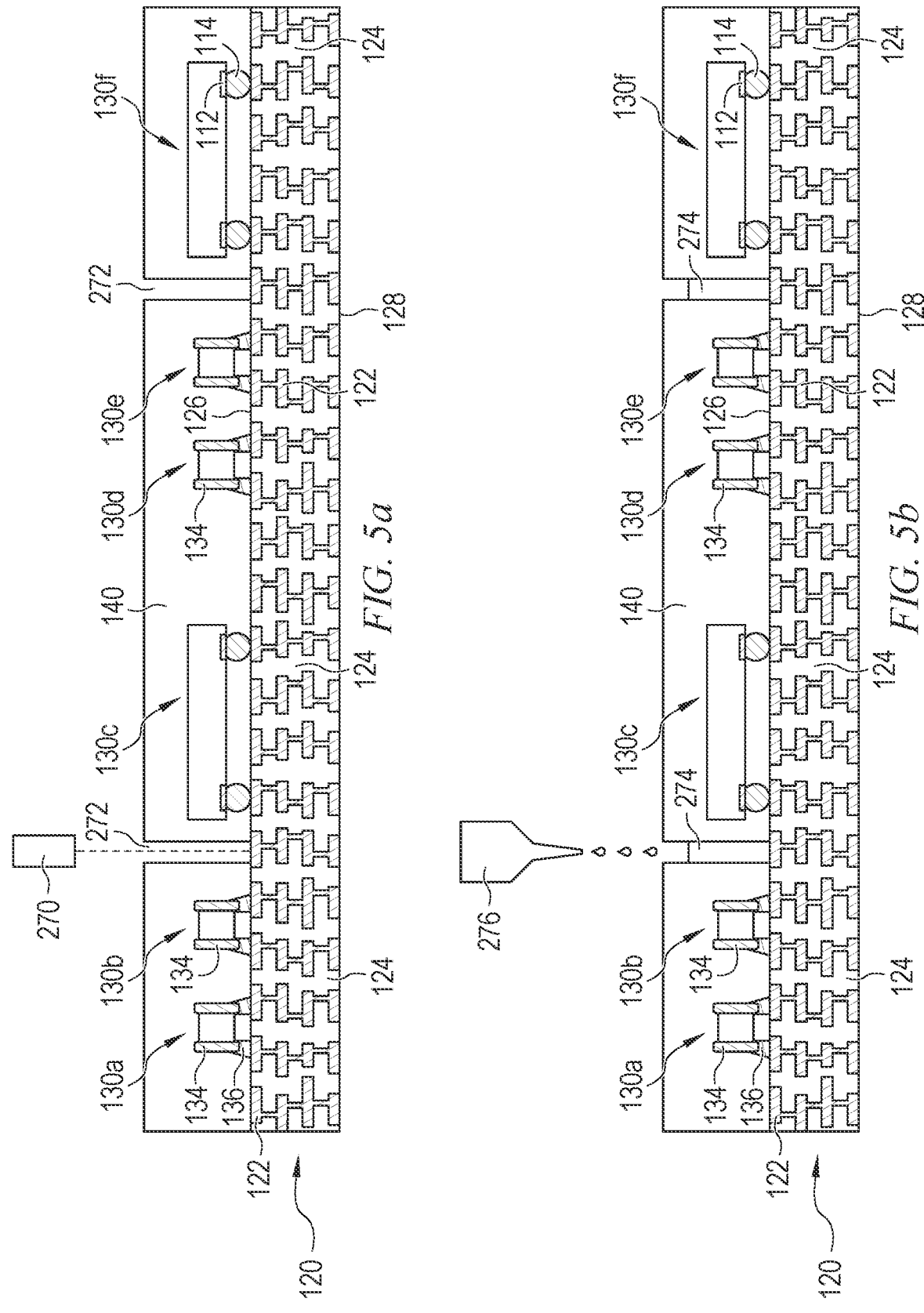
FIGS. 5a-5e illustrate a process of forming a vertical shielding layer through the first encapsulant.

In another embodiment, continuing from FIG. 2d, a portion of encapsulant 140 is removed using an etching process or LDA with laser 270 to form openings or vias 272 extending to surface 126 of substrate 120 and conductive layer 122, as shown in FIG. 5a.

In FIG. 5b, shielding material 274 is deposited in openings or vias 272 with dispenser 276. Further detail of applying shielding layer 274 is described in FIGS. 8a, 8b, and 9. Shielding material 274 makes electrical connection to conductive layer 122. Shielding layer 274 can be one or more layers of a matrix, such as thermal set material or polymer, with graphene covered cores embedded within the matrix, see further description in FIGS. 6a-6b and 7a-7c. Alternatively, shielding layer 274 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground.

Figures 5C, 5D:
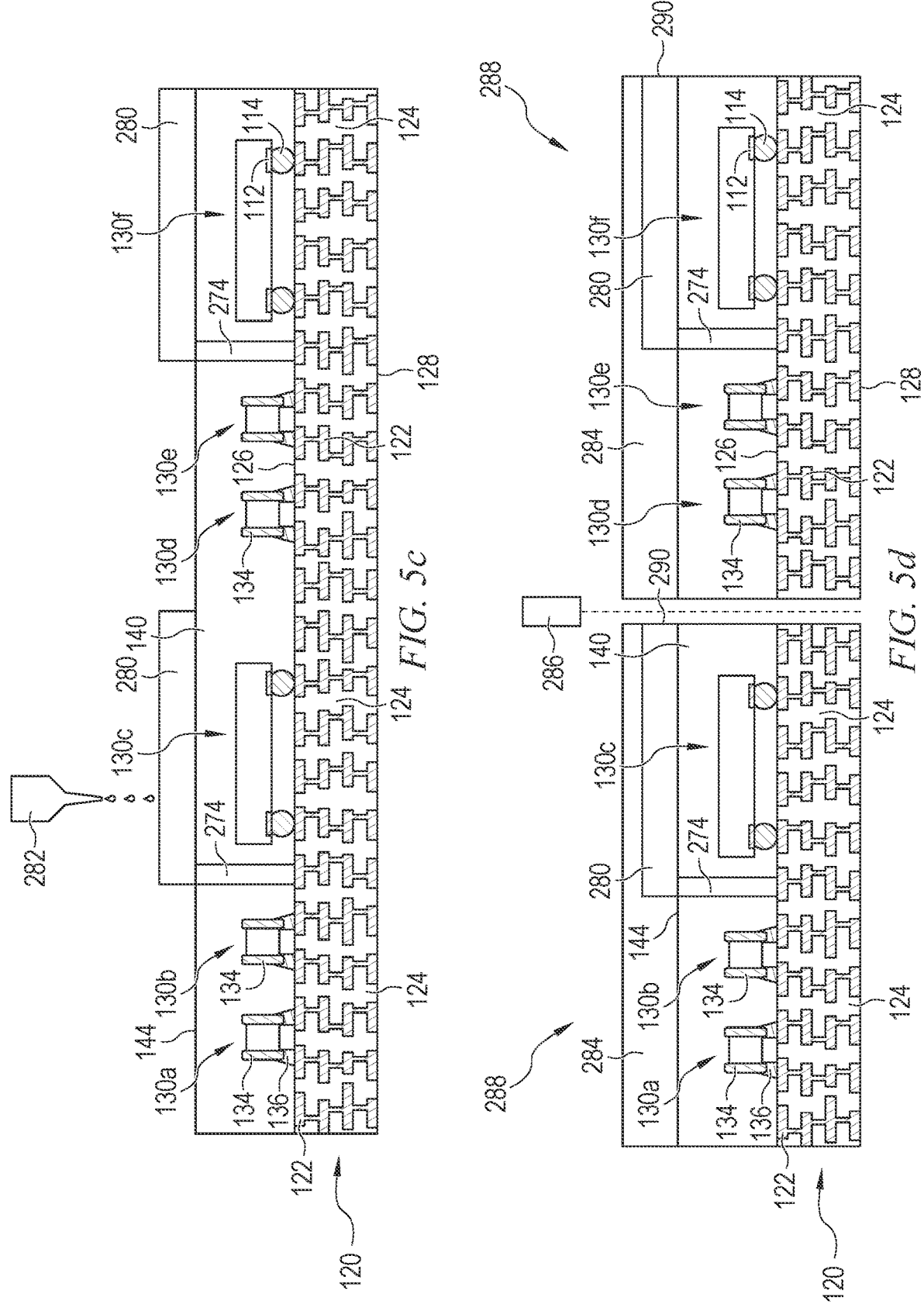

In FIG. 5c, partial shielding material or layer 280 is deposited over surface 144 of encapsulant 140 and into opening or via 272. Shielding layer 280 is a partial shielding layer as it is formed over electrical components 130c and 130f to reduce or inhibit the effects of EMI, RFI, and other inter-device interference from those devices. In one embodiment, shielding material 280 is printed or dispensed over surface 126 and into openings or vias 272 with printer or dispenser 282. Further detail of applying shielding layer 280 is described in FIGS. 8a, 8b, and 9. Shielding layer 280 can be a solid rectangular body, similar to FIG. 2f, or a continuous serpentine segment extending in one or more x-direction channels and one or more y-direction channels, similar to FIG. 2g. Shielding layer 280 makes electrical connection to shielding material 274. Shielding layer 280 can be one or more layers of a matrix, such as thermal set material or polymer, with graphene covered cores embedded within the matrix, see further description in FIGS. 6a-6b and 7a-7c. Alternatively, shielding layer 280 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground. Shielding layer 274 makes electric connection between shielding layer 280 and conductive layer 122. In that sense, shielding layer 274 can be a conductive post.

In FIG. 5d, encapsulant or molding compound 284 is deposited over surface 144 of encapsulant 140 and over partial shielding layer 280 using a paste printing, compressive molding, transfer molding, liquid encapsulant molding, vacuum lamination, spin coating, or other suitable applicator, similar to FIG. 2h. Encapsulant 284 can be liquid or granular polymer composite material, such as epoxy resin with filler, epoxy acrylate with filler, or polymer with proper filler. Encapsulant 284 is non-conductive, provides structural support, and environmentally protects the semiconductor device from external elements and contaminants. The reconstituted wafer or panel is singulated using saw blade or laser cutting tool 286 into individual semiconductor packages 288. The singulation exposes at least side surface 290 of shielding layer 280.

Figure 5E:
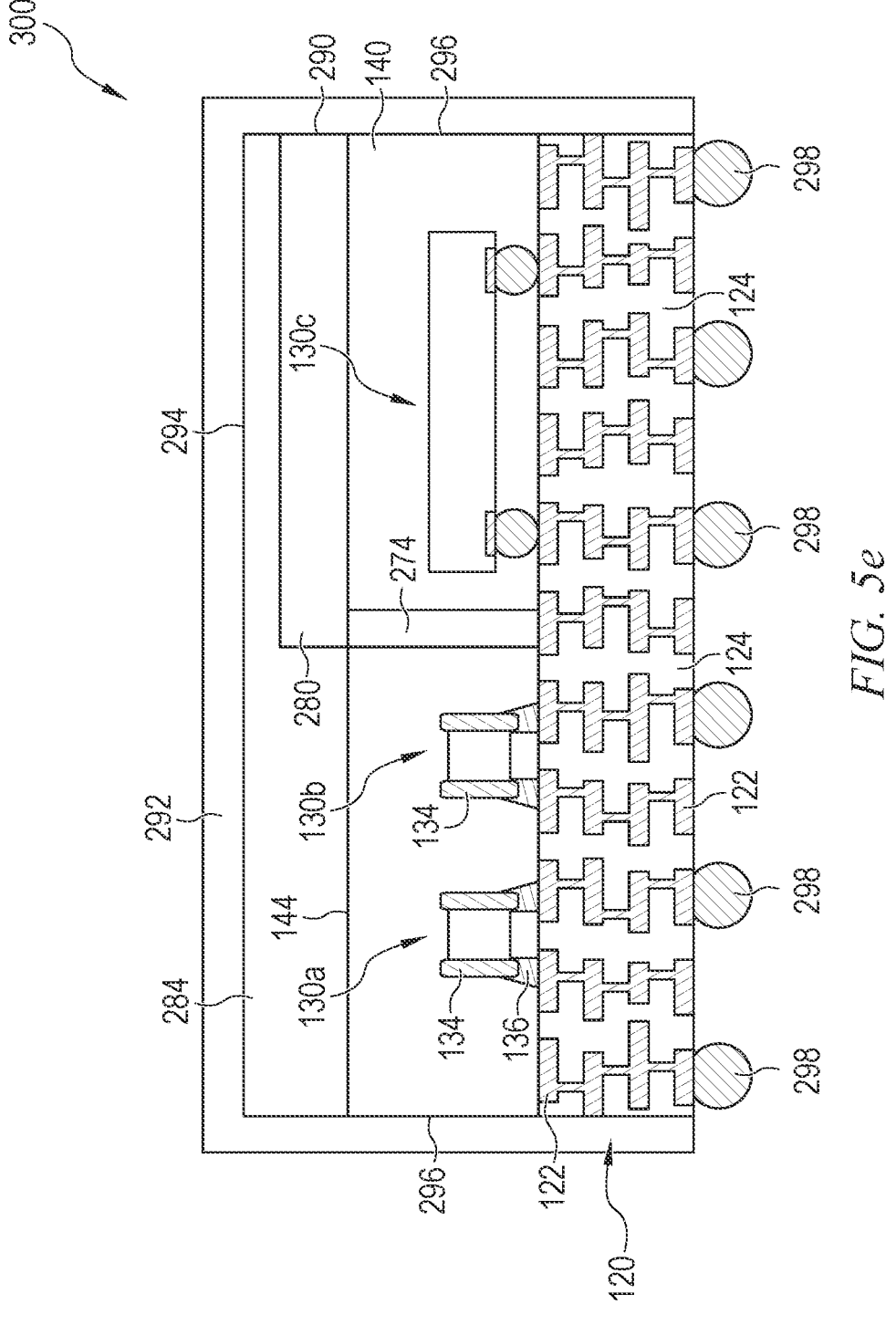

In FIG. 5e, shielding layer 292 is deposited, printed, or otherwise formed on surface 294 of encapsulant 284. Shielding layer 292 extends down side surfaces 296 and contacts side surface 290 and conductive layer 122. Shielding layer 292 can be one or more layers of a matrix, such as thermal set material or polymer, with graphene covered cores embedded within the matrix, see further description in FIGS. 6a-6b and 7a-7c. Alternatively, shielding layer 292 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground. Shielding layer 274 and 292 are grounded through conductive layer 122 of interconnect substrate 120.

An electrically conductive bump material is deposited over conductive layer 122 on surface 128 of substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 298. In one embodiment, bump 298 is formed over a UBM having a wetting layer, barrier layer, and adhesive layer. Bump 298 can also be compression bonded or thermocompression bonded to conductive layer 122. In one embodiment, bump 298 is a copper core bump for durability and maintaining its height. Bump 298 represents one type of interconnect structure that can be formed over conductive layer 122. The interconnect structure can also use bond wires, conductive paste, stud bump, micro bump, or other electrical interconnect.

The combination of substrate 120, electrical components 130a-130c, encapsulants 140 and 284, and shielding layers 274 and 292 constitutes SiP 300. A perspective view of SiP 300 with shielding layers 274 and 292 between encapsulants 140 and 284 would be similar to FIG. 2l.

Figure 6A:
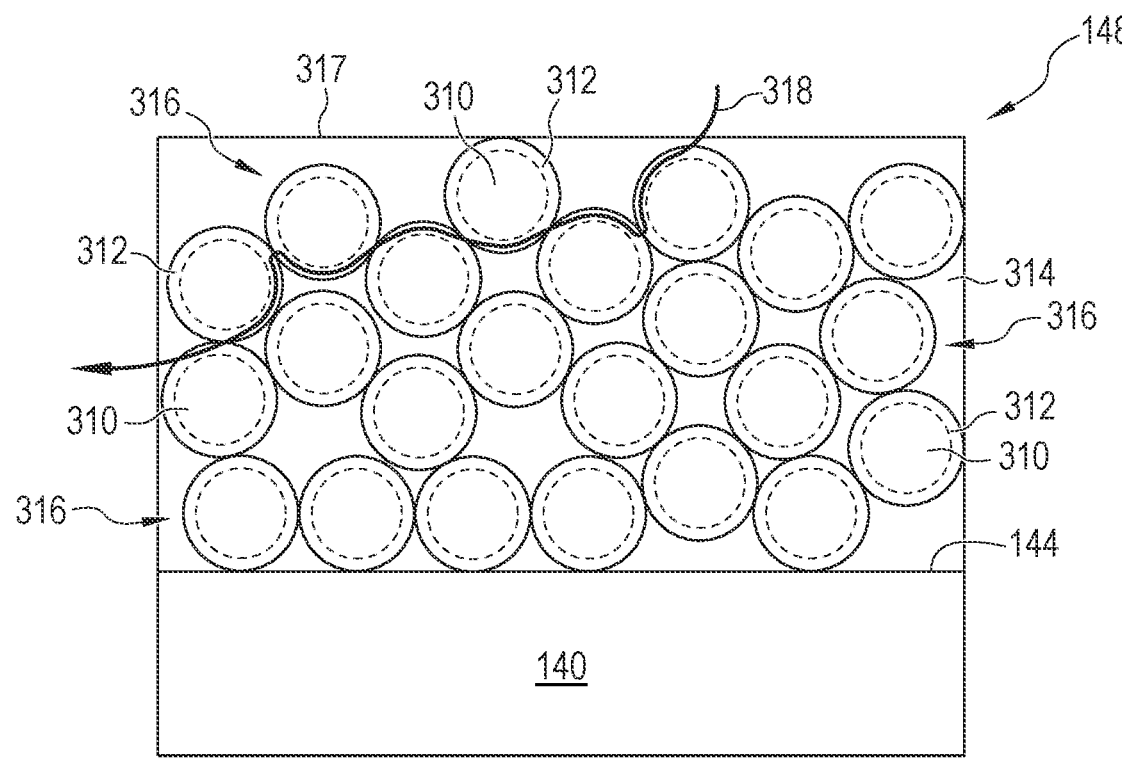
FIGS. 6a-6b illustrate further detail of the graphene core shell within the shielding layer.
Figure 6B:
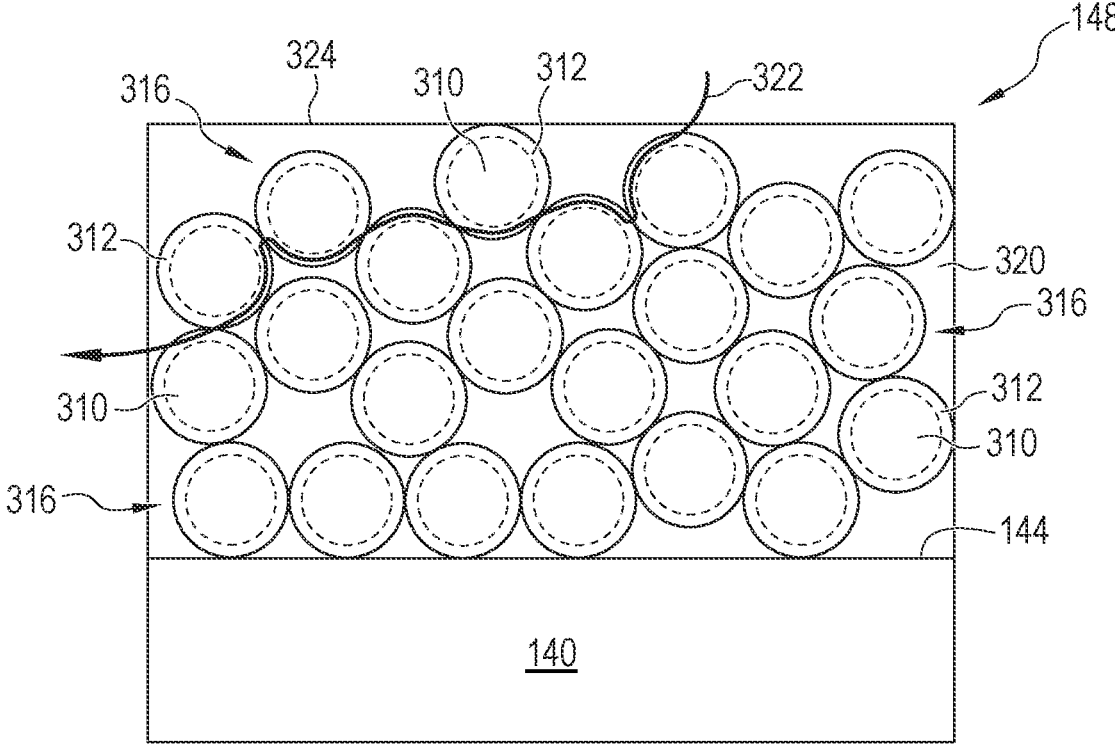

FIGS. 6a and 6b show further detail of region or box 148 from FIG. 2e. In one embodiment, shielding layer 142 includes matrix 314 and a plurality of cores 310 with graphene coating 312 as graphene core shells 316 embedded within the matrix, as shown in FIG. 6a. Matrix 314 can be a thermoset material, such epoxy resin or adhesive with filler containing alumina, Al, aluminum zinc oxide, or other material having good heat transfer and electrically conductive properties. Matrix 314 can be thermal grease such as silicon or polymer type such as polymethyl methacrylate (PMMA) or polyethylene terephthalate (PET). In one embodiment, core 310 is Cu, Ni, Ag, phase change material (PCM), or other suitable metal or similar material. Cores 310 are arranged within matrix 314 so that most if not all graphene coatings 312 covering the core contact at least one adjacent graphene coating to form a continuous and connecting electrical path 318 of graphene coatings through shielding material 142. A first graphene coating 312 contacts a second adjacent graphene coating, which in turn contacts a third adjacent graphene coating, and so on, to form continuous and connecting electrical path 318. Cores 310 have sufficient density that most if not all the graphene coatings around the cores contact at least one graphene coating around an adjacent core, and typically contact graphene coating of multiple adjacent cores. Graphene core shells 316 occupy space within matrix 314 between surface 317 of the matrix and surface 144 of encapsulant 140.

In another embodiment, matrix 314 is a polymer or composite epoxy with dispersed graphene, carbon nanotubes, conductive polymers, and the like. For example, matrix 314 can be an Ag ink epoxy for shielding layer 142.

FIG. 6b shows another embodiment of region or box 148 from FIG. 2e with a portion of shielding layer 142 and encapsulant 140. In this case, matrix 320 is solder containing one or more elements of Sn, lead (Pb), or indium (In). Again, core 160 can be Cu, Ni, PCM, or other suitable metal or similar material. Each core 310, as embedded in matrix 320, is surrounded or covered by graphene coating or shell 312. In one embodiment, a graphene paste or ink is formed around a Cu core as graphene core shell 316.

Cores 310 are arranged within matrix 320 so that most if not all graphene coatings 312 covering the core contact at least one adjacent graphene coating to form a continuous and connecting path 322 of graphene coatings through conductive material 142. Graphene coating 312 of each core 310 contacts the graphene coating of an adjacent core. A first graphene coating 312 contacts a second adjacent graphene coating, which in turn contacts a third adjacent graphene coating, and so on, to form continuous and connecting path 322. Cores 310 have sufficient density that most if not all the graphene coatings around the cores contact at least one graphene coating around an adjacent core, and typically contact graphene coating of multiple adjacent cores. Graphene core shells 316 occupy space within matrix 320 between surface 324 of the matrix and surface 144 of encapsulant 140.

Figures 7A, 7B, 7C:
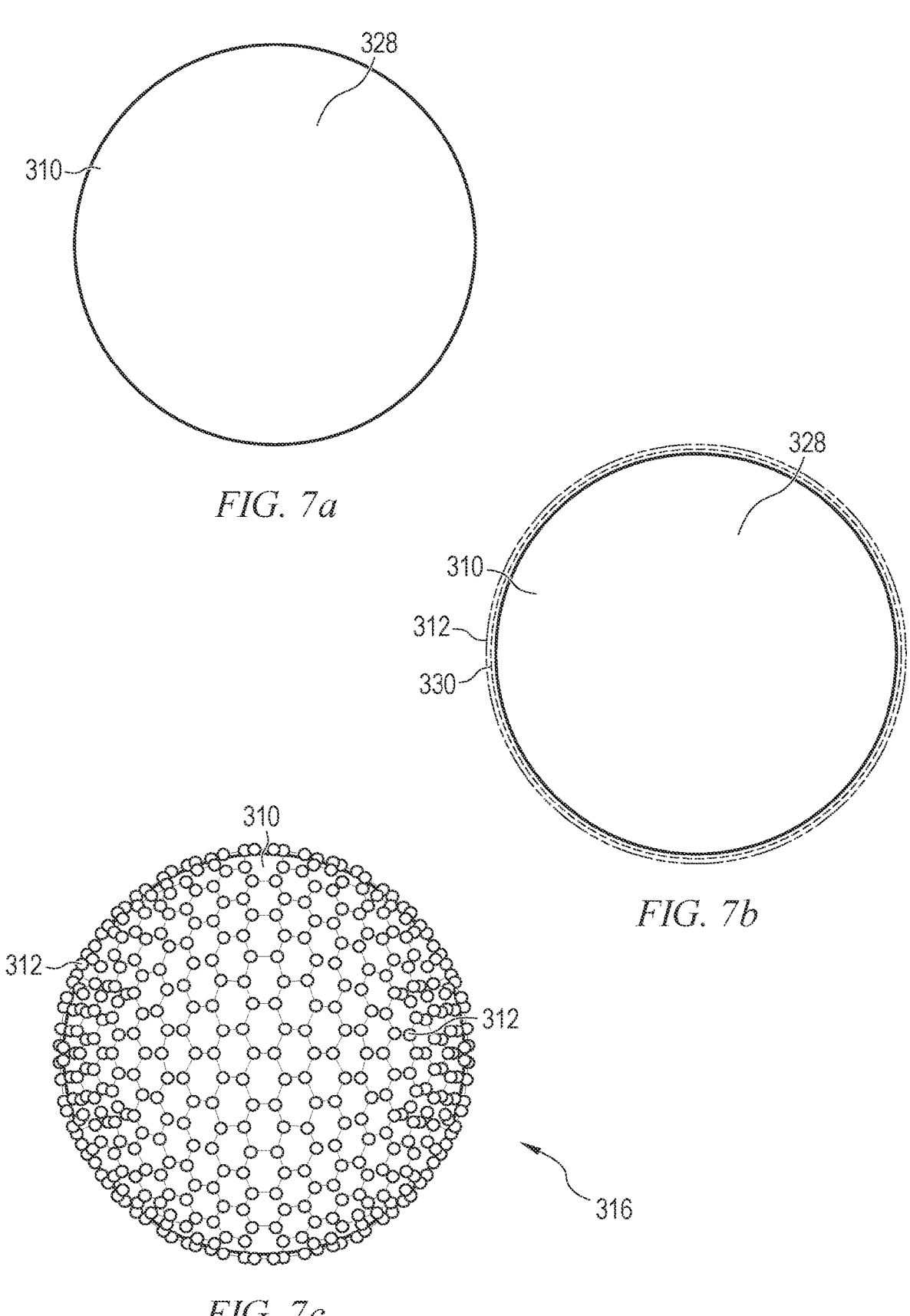
FIGS. 7a-7c illustrate a process of forming a graphene core shell.

FIGS. 7a-7c illustrate further detail of core 310, graphene coating 312, and graphene core shell 316. In one embodiment, core 310 is Cu, Ni, PCM, or other suitable metal or similar material. FIG. 7b illustrates graphene coating 312 formed over and around surface 328 of core 310. FIG. 7c illustrates further detail of graphene coating 312 formed as a mesh network around surface 328 of core 310, collectively graphene core shell 316. Graphene 312 is an allotrope of carbon with one or more layers of carbon atoms each arranged in a two-dimensional (2D) honeycomb lattice. Graphene coating 312 can be formed by CVD. Core 310 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene coating 312 on surface 328 of core 310. The release of carbon atoms over core 310 forms a continuous sheet of graphene coating 312. Additional information related to forming graphene coating by CVD is disclosed in U.S. Pat. No. 8,535,553, and hereby incorporated by reference.

Core 310 is PCM capable of phase change from solid to liquid phase or from liquid phase to solid phase within the operating temperature range of the semiconductor chip, e.g., 20-200° C. A first coating 330 is formed around PCM core 310, as shown in FIG. 7b and discussed in published Korean application KR101465616B1. The first coating 330 can be a polymer intermediate layer. A second coating 312 is formed over the first coating 330. Matrix 314, 320 with graphene covered cores is further disclosed in U.S. Pat. No. 10,421, 123, and all are incorporated herein by reference.

The properties of graphene are summarized in Table 1, as follows:

TABLE 1

| Properties of graphene | |
| --- | --- |
| Parameter | |
| Electronic mobility | $2 \times 10^5$ cm$^2$ V$^{-1}$ s$^{-1}$ |
| Current density | $10^9$ A cm$^{-1}$ |
| Velocity of fermion (electron) | $10^6$ m s$^{-1}$ |
| Thermal conductivity | 4000-5000 W m$^{-1}$ K$^{-1}$ |
| Tensile strength | 1.5 Tpa |
| Breaking strength | 42 N m$^{-1}$ |
| Transparency | 97.7% |
| Elastic limit | 20% |
| Surface area | 2360 m$^2$ g$^{-1}$ |

Graphene 312 has 100 times the electrical conductivity of Cu. Graphene 312 enables epoxy to exhibit electrical conductivity similar to Ag, while reducing or eliminating oxidation. Core shell 316 with Cu and graphene epoxy is low cost, as compared to sputtering. Graphene 312 has a low moisture permeability and a high thermal conductivity of 4000-5000 W m$^{-1}$ K$^{-1}$, 10 times higher than Cu at room temperature. Since carbon also has a good solderability and wettability of solder paste. Graphene 312 exhibits a high degree of flexibility and remains stable against warpage. Shielding material 142 with graphene Cu shells 316 improves electrical conductivity, while lowering manufacturing cost.

The above description in FIGS. 6a-6b and 7a-7c apply to shielding material or layers 170, 186, 200, 230, 250, 274, 280, and 292.

Figure 8A:
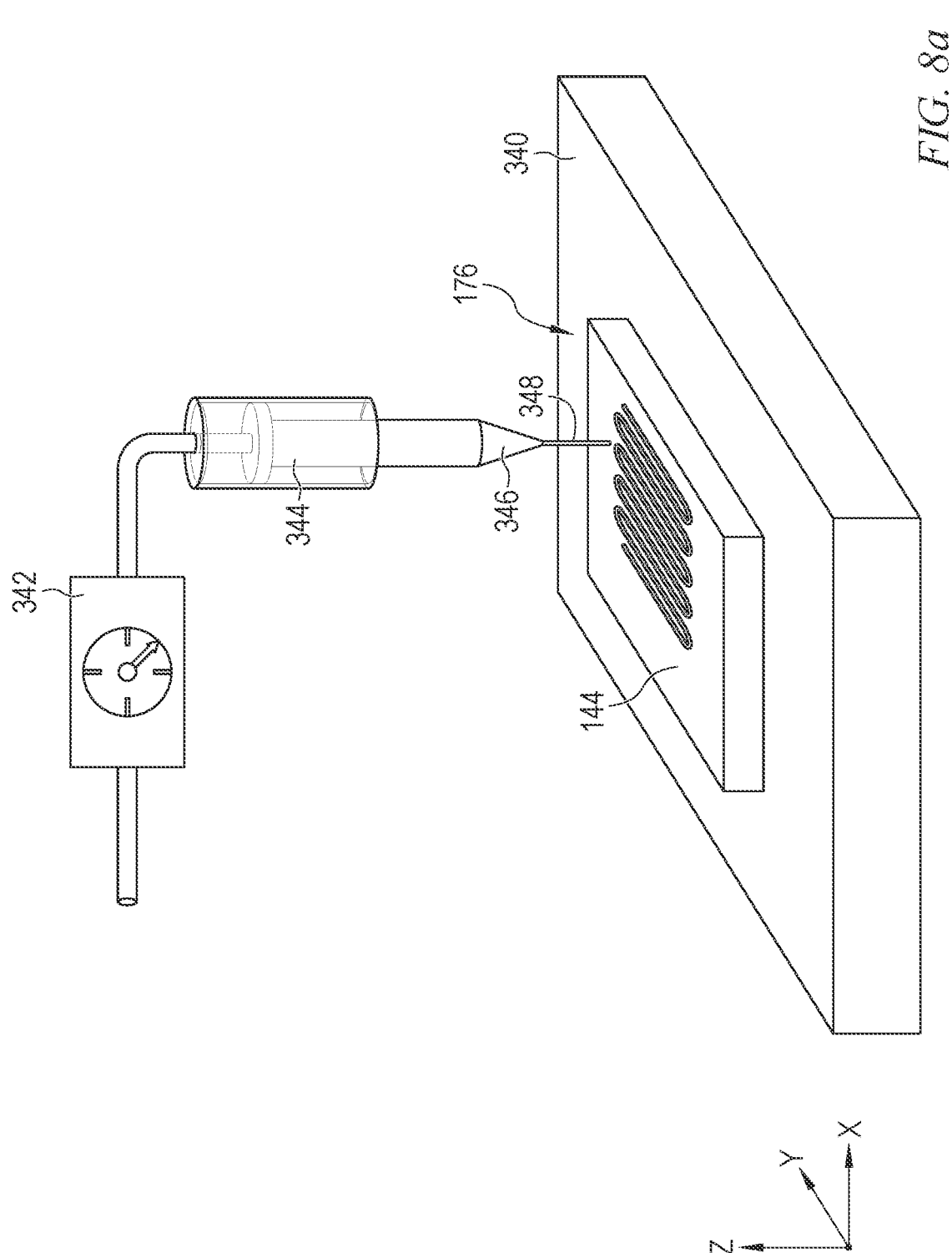
FIGS. 8a-8b illustrate using EHD jet printing to deposit the shielding material over the encapsulant.
Figure 8B:
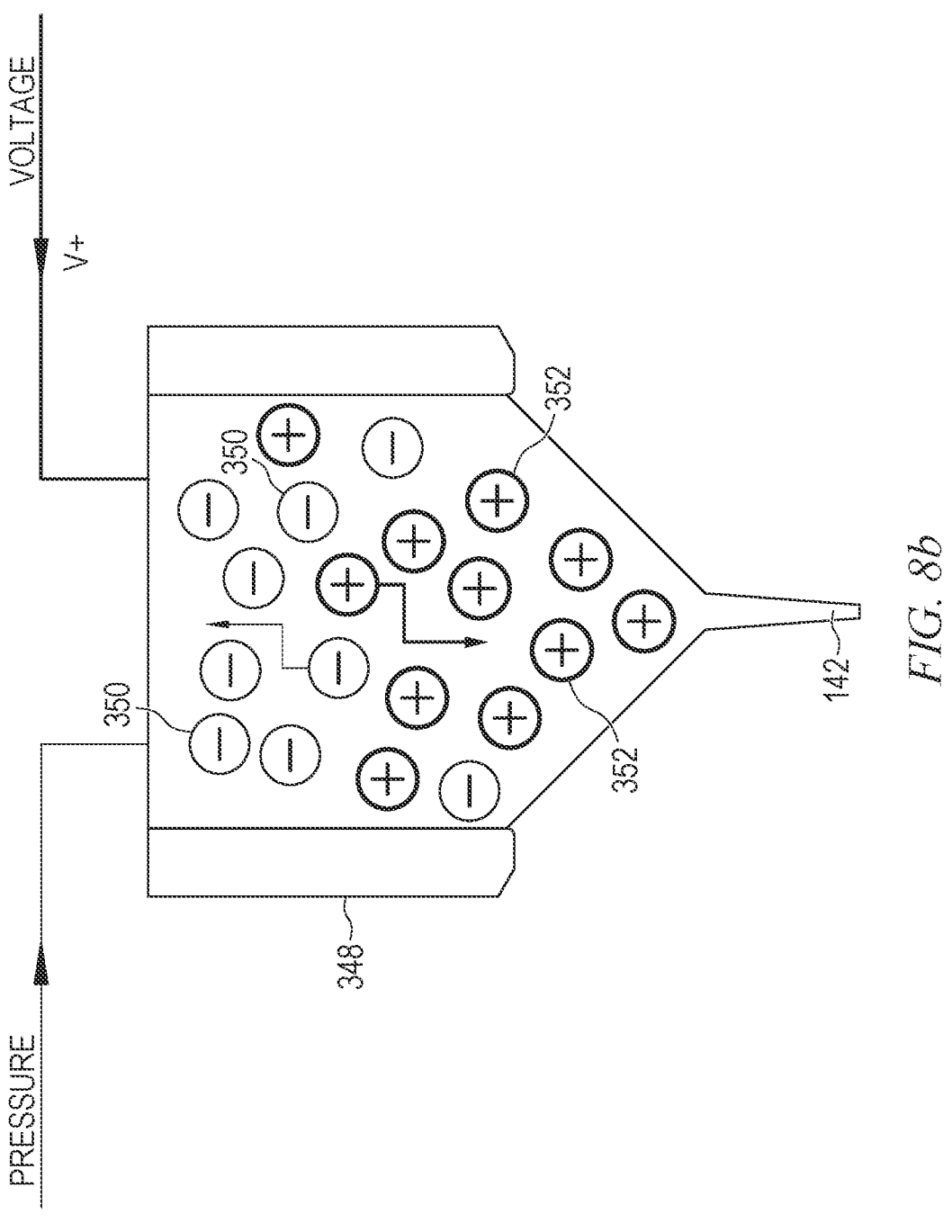

FIG. 8a shows depositing shielding layer 142 over surface 144 of encapsulant 140 in SiP 176 using electrohydrodynamic (EHD) jet printing. SiP 176 is placed on substrate 340 capable of three dimensional (x, y, z directions) movement to control distribution of shielding material on surface 144. Pneumatic regulator 342 with pressure gauge applies pressure to syringe pump 344 containing shielding material, such as conductive and non-conductive ink. Conical section 346 narrows the ink path to injection nozzle 348, which deposits the ink on surface 144 of encapsulant 140 in a controlled manner. More specifically, injection nozzle 348 performs ink jetting by an electric field and pressure between the nozzle and substrate. In FIG. 8b, pressure is applied from pneumatic regulator 342. A voltage source induces an electric field shown as negative charges 350 and positive charges 352. The printed liquid is driven by the electric field to achieve direct pattern, high resolution printing of shielding layer 142.

Figure 9:
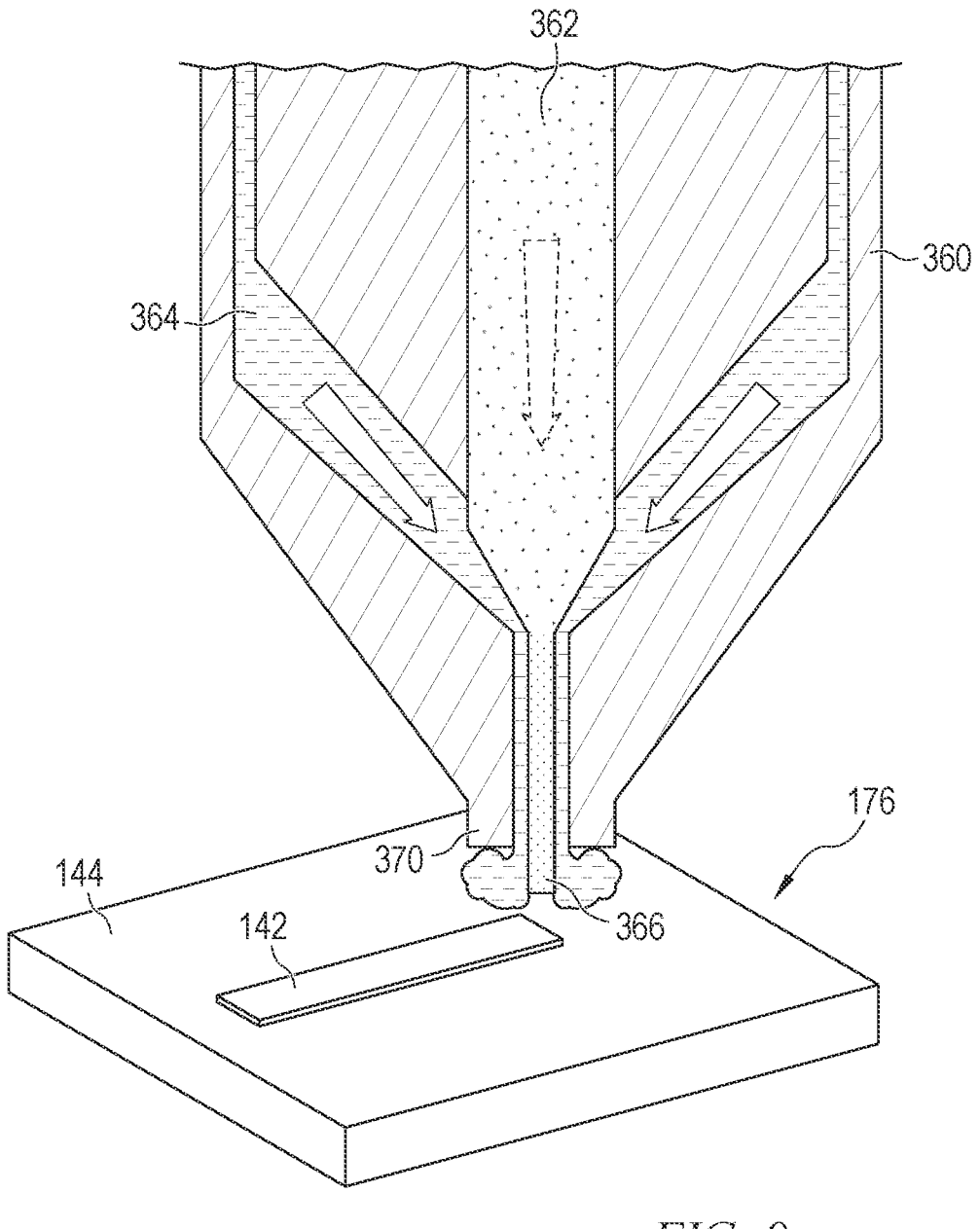
FIG. 9 illustrates using aerosol jet printing to deposit the shielding material over the encapsulant.

FIG. 9 shows depositing shielding layer 142 over surface 144 of encapsulant 140 in SiP 176 using aerosol jet printing. Dispenser 360 includes channel 362 for the flow of shielding material, such as conductive and non-conductive ink, and channel 364 for the flow of a gas, such as nitrogen. The shielding material is mixed with the gas and deposits the ink from nozzle or head 370 on surface 144 of encapsulant 140 as an aerosol jet. The printed liquid, i.e., shielding layer 142 is dispensed as a jetting of aerosol focused by sheath gas at the end of head 370.

Figure 10:
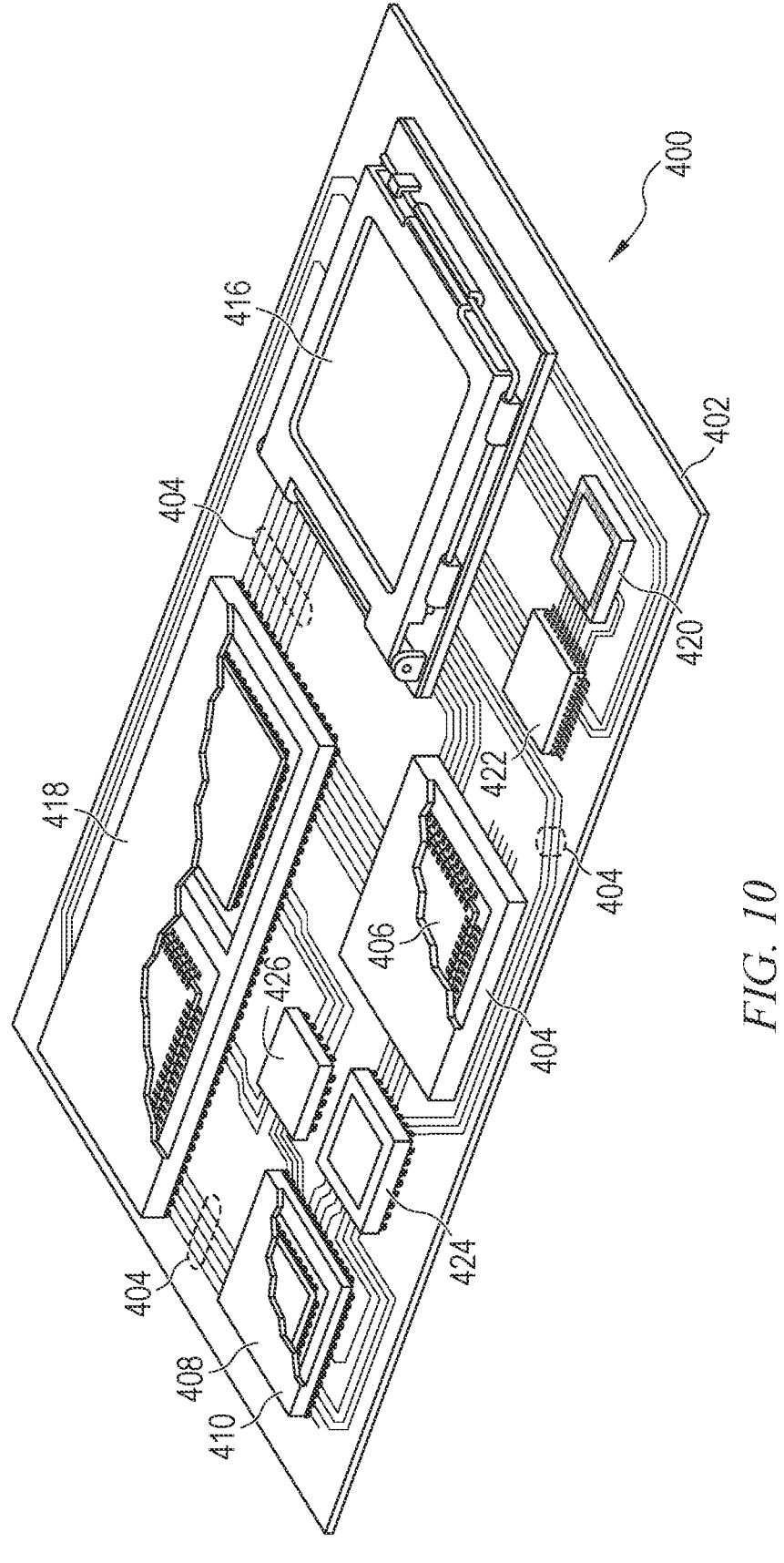
FIG. 10 illustrates a printed circuit board (PCB) with different types of packages disposed on a surface of the PCB.

FIG. 10 illustrates electrical device 400 having a chip carrier substrate or PCB 402 with a plurality of semiconductor packages disposed on a surface of PCB 402, including SiP 176, 210, 260, and 300. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 10, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   an electrical component disposed over the substrate;
   a first encapsulant deposited over the electrical component and substrate;
   a first shielding layer including a graphene core shell formed on a surface of the first encapsulant; and
   a second encapsulant deposited over the first encapsulant and first shielding layer.

2. The semiconductor device of claim 1, further including a second shielding layer formed over the second encapsulant.

3. The semiconductor device of claim 1, wherein the graphene core shell includes a copper core.

4. The semiconductor device of claim 1, wherein the first shielding layer includes a plurality of cores covered by graphene and the graphene is interconnected within the first shielding layer to form an electrical path.

5. The semiconductor device of claim 1, wherein the first shielding layer includes thermoset material or polymer or composite epoxy type matrix and the graphene core shell is embedded within the thermoset material or polymer or composite epoxy type matrix.

6. A semiconductor device, comprising:
   a substrate;
   a first encapsulant deposited over the substrate;
   a first shielding layer including a graphene core shell formed on a surface of the first encapsulant, wherein the graphene core shell includes a copper core; and
   a second encapsulant deposited over the first encapsulant and first shielding layer.

7. The semiconductor device of claim 6, further including a second shielding layer formed over the second encapsulant.

8. The semiconductor device of claim 6, further including an electrical component disposed over the substrate.

9. The semiconductor device of claim 6, wherein the first shielding layer includes a plurality of cores covered by graphene and the graphene is interconnected within the first shielding layer to form an electrical path.

10. The semiconductor device of claim 6, wherein the first shielding layer includes thermoset material or polymer or composite epoxy type matrix and the graphene core shell is embedded within the thermoset material or polymer or composite epoxy type matrix.

11. A method of making a semiconductor device, comprising:
    providing a substrate;
    disposing an electrical component over the substrate;
    depositing a first encapsulant over the electrical component and substrate;
    forming a first shielding layer including a graphene core shell on a surface of the first encapsulant; and
    depositing a second encapsulant over the first encapsulant and first shielding layer.

12. The method of claim 11, further including forming a second shielding layer over the second encapsulant.

13. The method of claim 11, wherein the graphene core shell includes a copper core.

14. The method of claim 11, wherein the first shielding layer includes a plurality of cores covered by graphene and the graphene is interconnected within the first shielding layer to form an electrical path.

15. The method of claim 11, wherein the first shielding layer includes thermoset material or polymer or composite epoxy type matrix and the graphene core shell is embedded within the thermoset material or polymer or composite epoxy type matrix.

16. A method of making a semiconductor device, comprising:

providing a substrate;

depositing a first encapsulant over the substrate;

forming a first shielding layer including a graphene core shell on a surface of the first encapsulant, wherein the graphene core shell includes a copper core; and depositing a second encapsulant over the first encapsulant and first shielding layer.

17. The method of claim 16, further including disposing an electrical component over the substrate.

18. The method of claim 16, further including forming a second shielding layer over the second encapsulant.

19. The method of claim 16, wherein the first shielding layer includes a plurality of cores covered by graphene and the graphene is interconnected within the first shielding layer to form an electrical path.

\* \* \* \* \*